(12) United States Patent
Hosomura et al.

(10) Patent No.: US 7,646,646 B2
(45) Date of Patent: Jan. 12, 2010

(54) NONVOLATILE SEMICONDUCTOR MEMORY DEVICE

(75) Inventors: Yoshikazu Hosomura, Kamakura (JP); Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 153 days.

(21) Appl. No.: 12/032,206

(22) Filed: Feb. 15, 2008

(65) Prior Publication Data

US 2008/0198667 A1 Aug. 21, 2008

(30) Foreign Application Priority Data

Feb. 15, 2007 (JP) ............................. 2007-035159

(51) Int. Cl.
*G11C 16/06* (2006.01)
*G11C 16/04* (2006.01)

(52) U.S. Cl. .............................. 365/185.25; 365/185.17

(58) Field of Classification Search ............. 365/185.25
See application file for complete search history.

(56) References Cited

U.S. PATENT DOCUMENTS

| | | | |
|---|---|---|---|
| 6,807,083 B2 | 10/2004 | Yamamura | |
| 6,862,236 B2 | 3/2005 | Maruyama | |
| 6,917,072 B2 | 7/2005 | Noguchi et al. | |
| 6,961,268 B2 | 11/2005 | Umezawa | |
| 6,996,024 B2 * | 2/2006 | Tanzawa et al. | ............. 365/226 |
| 7,099,193 B2 | 8/2006 | Futatsuyama | |
| 7,468,919 B2 * | 12/2008 | Sekar et al. | ............. 365/185.27 |
| 2006/0072359 A1 | 4/2006 | Futatsuyama et al. | |

FOREIGN PATENT DOCUMENTS

| | | |
|---|---|---|
| JP | 5-217388 | 8/1993 |
| JP | 2005-108404 | 4/2005 |

\* cited by examiner

*Primary Examiner*—Son L Mai
(74) *Attorney, Agent, or Firm*—Oblon, Spivak, McClelland, Maier & Neustadt, L.L.P.

(57) ABSTRACT

According to one embodiment, a nonvolatile semiconductor memory device includes: a memory cell array having: a cell string including a plurality of memory cells connected in series; a plurality of word lines respectively connected to the plurality of memory cells; a source side selecting gate connected to one end of the cell string; and a drain side selecting gate connected to the other end of the cell string; a word line selector that selects one of the word lines connected to a target memory cell to be written; and an equalizing unit that equalizes voltages of the plurality of word lines after data write of the target memory cell is finished.

15 Claims, 20 Drawing Sheets

NONVOLATILE SEMICONDUCTOR MEMORY DEVICE

CROSS-REFERENCE TO RELATED APPLICATIONS

This application is based upon and claims the benefit of priority from Japanese Patent Application No. 2007-035159, filed Feb. 15, 2007, the entire contents of which are incorporated herein by reference.

BACKGROUND OF THE INVENTION

The present invention relates to a nonvolatile semiconductor storing apparatus of an NAND type flash memory or the like.

In a nonvolatile semiconductor storing apparatus, a distance between wirings is shortened since development of a micromachining technology has been progressed. On the other hand, it is difficult to thin a tunnel oxide film thickness in forming a memory cell at inside of a nonvolatile storing apparatus particularly from a view point or reliability.

According to the above-described two points, in a Total capacitance of a word line WL formed along with the memory cell, a rate occupied by a capacitance between the word line WL-gate tends to be low and a rate occupied by a capacitance between the word line WL-word line WL tends to be high. Further, in a Total capacitance of a source side selecting gate line SGS and a drain side selecting gate line SGD, a rate occupied by a capacitance between the source side selecting gate line SGS-gate and a capacitance between the drain side selecting gate line SGD-gate tends to be low, and a rate occupied by a capacitance between the source side selecting gate line SGS-word line WL and a capacitance between the drain side selecting gate line SGD-word line WL tends to be high.

Generally, according to a nonvolatile semiconductor storing apparatus, in a case in which a capacitive coupling is present between wiring-wiring, when a voltage applied to one wiring is changed in amplitude thereof, also a potential of other wiring is changed in an amplitude thereof. In this case, the potential change in the amplitude generated at other wiring is operated as noise, and therefore, hereinafter, the phenomenon is referred to as coupling noise.

That is, according to a nonvolatile semiconductor storing apparatus, in accordance with a progress in generation and a progress in micromachining, a coupling noise generated between word line WL-word line WL and a coupling noise generated between the drain side selecting gate line SGD-word line WL tend to be increased.

In order to reduce the coupling noise, there is proposed a nonvolatile semiconductor storing apparatus in which when a data is written to a memory cell, a memory cell of a word line WL applied with a reference voltage is cut off, and timings of voltages supplied to word line WL disposed contiguous to both sides of the word line WL are made to differ from each other (refer to, for example, JP-A-2005-108404).

SUMMARY OF THE INVENTION

According to an aspect of the present invention, there is provided a nonvolatile semiconductor memory device including: a memory cell array having: a cell string including a plurality of memory cells connected in series; a plurality of word lines respectively connected to the plurality of memory cells; a source side selecting gate connected to one end of the cell string; and a drain side selecting gate connected to the other end of the cell string; a word line selector that selects one of the word lines connected to a target memory cell to be written; and an equalizing unit that equalizes voltages of the plurality of word lines after data write of the target memory cell is finished.

According to another aspect of the present invention, there is provided a control method for a nonvolatile semiconductor memory device having: a memory cell array having: a cell string including a plurality of memory cells connected in series; a plurality of word lines respectively connected to the plurality of memory cells; a source side selecting gate connected to one end of the cell string; and a drain side selecting gate connected to the other end of the cell string, the method comprising: selecting one of the word lines that is connected to a target memory cell to be written; writing a data to the target memory cell; and equalizing the word lines after finishing the writing step.

BRIEF DESCRIPTION OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION OF THE PREFERRED EMBODIMENTS (Outline of Coupling Noise)

Figure 15:
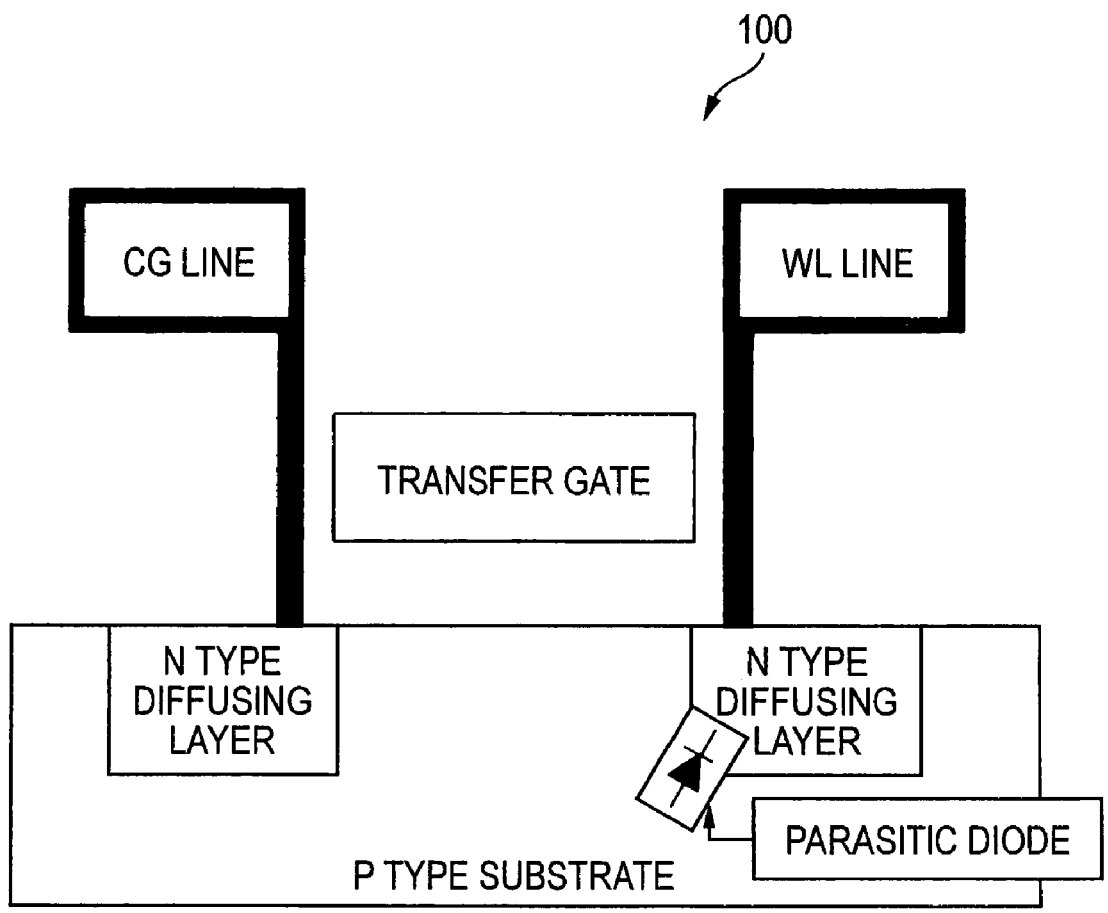
FIG. 15 is an exemplary view showing a section of an NMOS transfer transistor used in an NAND type flash memory.
Figure 16:
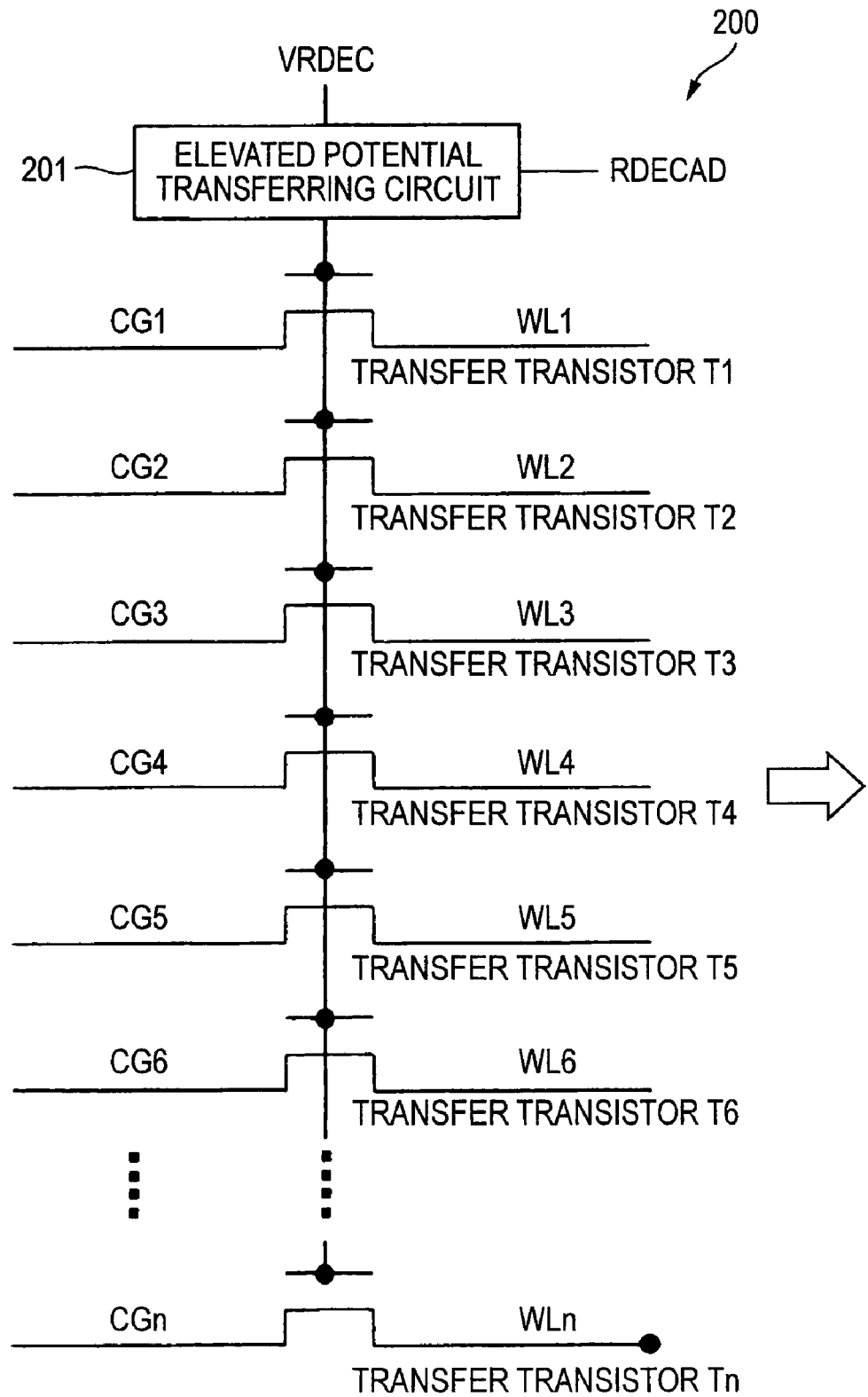
FIG. 16 is an exemplary view showing a circuit constitution of a word line driver used in an NAND type flash memory.

An explanation will be given of an example of applying an NAND type flash memory as a nonvolatile storing apparatus with regard to details of generating a coupling noise in reference to FIG. 15 through FIG. 18 as follows. FIG. 15 is a drawing showing a section of an NMOS transfer transistor 100 used in an NAND type flash memory. FIG. 16 is a drawing showing a circuit constitution of a word line driver (hereinafter, referred to as WL driver) used in an NAND type flash memory. In FIG. 16, a voltage is transferred from control gate lines CG1 through CGn to a memory cell (not illustrated) by making NMOS transfer transistors T1 through Tn ON.

A parasitic diode is present at the NMOS transfer transistor 100 as shown by FIG. 15. A joint portion of the NMOS transfer transistor 100 forms PN junction comprising a PN type silicon substrate and an N type diffusion layer. There is a threshold voltage Vth of about 0.7 V at the PN junction. The P type silicone substrate is at ground potential, and therefore, when a potential of the word line WL becomes lower than −0.7 V, there is a possibility that the PN junction becomes a forward direction bias to bring about a bipolar operation.

The bipolar operation has a possibility of an erroneous operation for the NAND type flash memory such that latch up is brought about thereafter, and therefore, the potential of the word line WL needs not to be lower than −0.7. Further, also in an NMOS transfer transistor (not illustrated) for transmitting a voltage to the source side selecting gate line SGS or the drain side selecting gate line SGD, a parasitic diode is similarly present. Therefore, also potentials of the source side selecting gate line SGS and the drain side selecting gate line SGD need not to be lower than −0.7 V.

The coupling noise is conceived to cause to make the potentials of the word line WL, the source side selecting gate line SGS and the drain side selecting gate line SGD lower than −0.7 V. In the NAND type flash memory, an operation in which the phenomenon of the coupling noise significantly appears is brought about when a write voltage (hereinafter, referred to as Vpgm. Vpgm is about 20 V) applied to the word line WL is dropped to 0 V.

Figure 17:
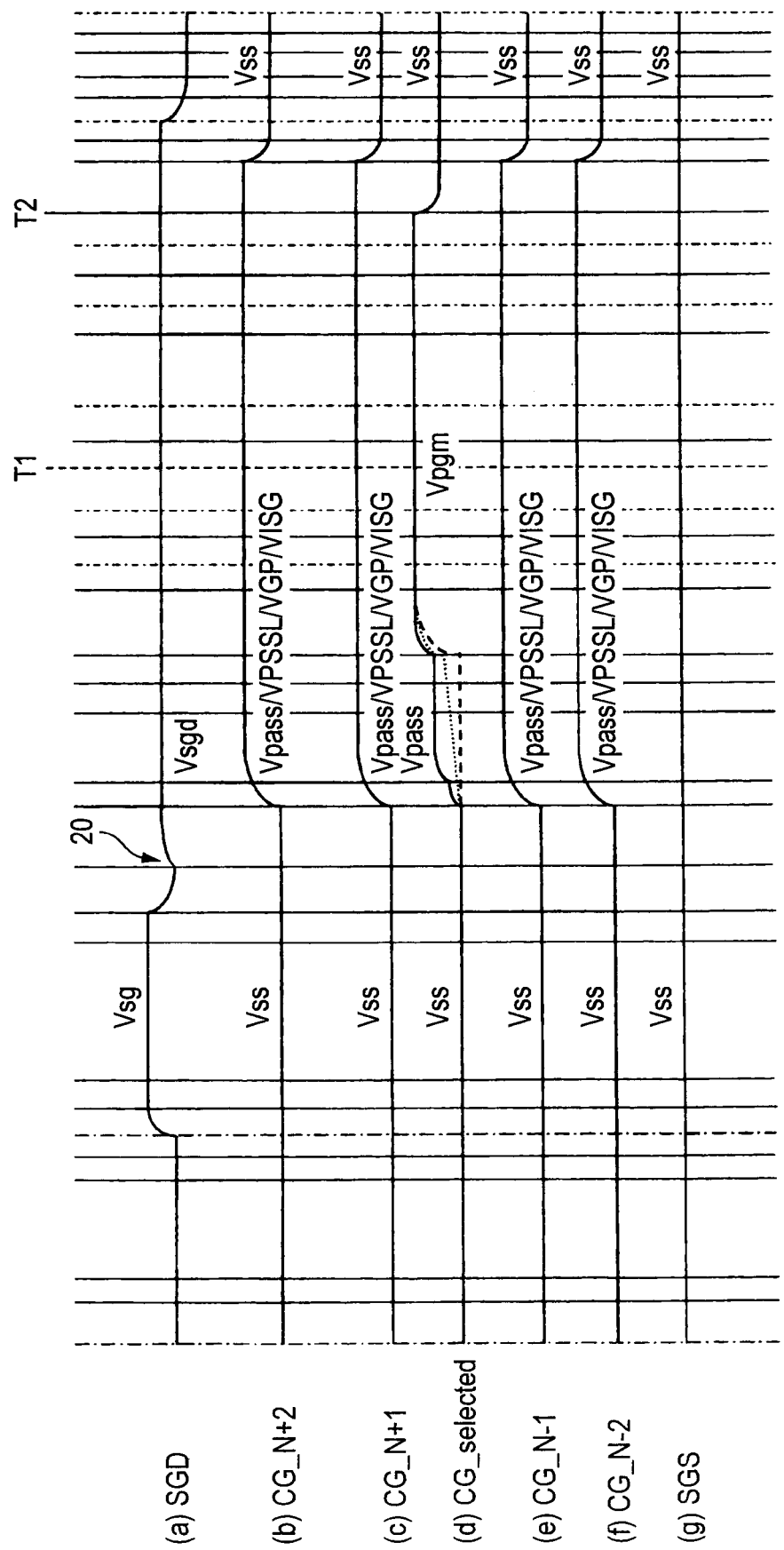
FIG. 17 is an exemplary timing chart respectively showing (a) a voltage Vsg applied to a drain side selecting gate line SGD, (b) through (f) voltages Vpass, Vpgm applied to control gate lines CG_N+2 through CG_N−2, CG_selected, (g) a state of a source side selecting gate line SGS.

Next, an explanation will be given of the write operation in the NAND type flash memory in reference to a timing chart shown in FIG. 17. In FIG. 17, (a) shows a voltage Vsg applied to the drain side selecting gate line SGD, (b) through (f) show voltages Vpass and Vpgm applied to control gate lines CG_N+2 through CG_N−2, CG_selected, (g) shows a state of the source side selecting gate line SGS, respectively. In the following explanation, attention is paid to operations of respective portions at the timing T1.

FIG. 17(*d*) shows a write voltage Vpgm applied to the control gate line CG_selected in correspondence with the word line WL selected in writing (hereinafter, referred to as selected word line WL). FIG. 17(*b*), (c), (e) and (f) show the voltage Vpass applied to the control gate line CG_N+2, CG_N+1, CG_N−1, CG_N−2 in correspondence with the word lines WL which is not selected in writing (hereinafter, referred to as nonselected word line WL).

In writing operation, the write voltage Vpgm is transferred from the control gate line CG_selected to the selected word line WL. A middle voltage less than the write voltage Vpgm (hereinafter, referred to as voltage Vpass. Vpass is about 7V.) is transferred from the control gate lines CG_N+2, CG_N+1, CG_N−1, CG_N−2 to the nonselected word lines WL in writing operation.

Figure 18:
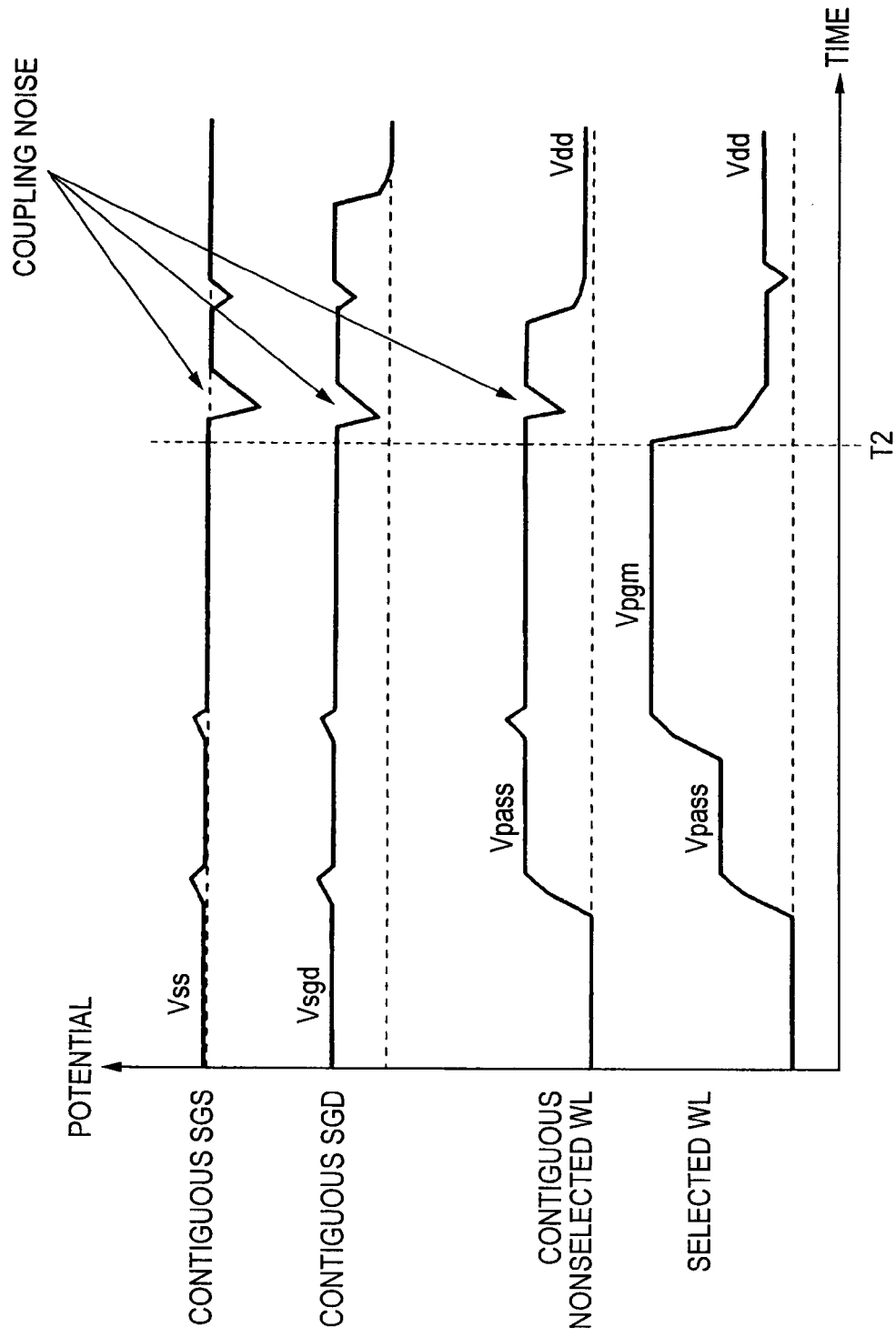
FIG. 18 is an exemplary timing chart showing respective operations of a contiguous source side selecting gate line SGS, a contiguous drain side selecting gate line SGD, a contiguous nonselected word line WL and a selected word line WL.

After finishing the writing operation, the write voltage Vpgm applied to the selected word line WL is discharged (timing T2 in the drawings). There is a possibility of posing a state by a coupling noise generated when the selected word line WL is discharged. The following two points are conceivable as an unexpected effect. The effects will be explained in reference to FIG. 18. FIG. 18 is a timing chart showing respective operations of a contiguous source side selected gate line SGS, a contiguous drain side selecting gate line SGD, a contiguous nonselected word line DL and a selected word line WL.

(1) Influence to Contiguous Nonselected Word Line WL by coupling Noise

After finishing the writing operation, when the write voltage Vpgm is discharged to Vdd from the selected word line WL at timing T2 shown in FIG. 18, a coupling noise is generated at the nonselected word line WL contiguous thereto (referred to as contiguous nonselected word line WL). There is potential difference of about 13 V between the selected word line WL and the contiguous nonselected word line WL, and therefore, also the coupling noise generated at the nonselected word line WL is increased. The coupling noise lowers the potential of the voltage Vpass applied to the nonselected word line WL. When a reduction in the potential of the voltage Vpass becomes lower than −0.7V, there is a possibility of bringing about an erroneous operation in transfer transistors (transfer transistors T1 through Tn shown in FIG. 16) for transferring the voltage Vpass to the contiguous selected word line WL.

(2) Influence to SGS, SGD by Coupling Noise

In a case in which the selected word line WL is contiguous to the source side selecting gate line SGS or the drain side selecting gate line SGD, when the write voltage Vpgm is discharged to Vdd from the selected word line WL at the timing T2 shown in FIG. 18, a coupling noise is generated at the source side selected gate line SGS contiguous thereto (contiguous SGS in the drawing) or the drain side selecting gate line SGD contiguous thereto (contiguous SGD in the drawing). The coupling noise lowers respective potentials of voltages Vss (0 V), Vsgd (about 2 V) applied to contiguous SGS and contiguous SGD. When a reduction in the potentials of the voltages Vss, Vsgd becomes lower than −0.7V, there is a possibility of bringing about an erroneous operation in respective NMOS transfer transistors (not illustrated) for transferring voltage to the source side selecting gate line SGS and the drain side selecting gate line SGD.

Embodiments of the invention will be explained in details in reference to the drawings as follows. However, the invention is embodied in a number of different modes and is not to be interpreted to be limited to contents of embodiments shown below.

Embodiment 1

Figure 1:
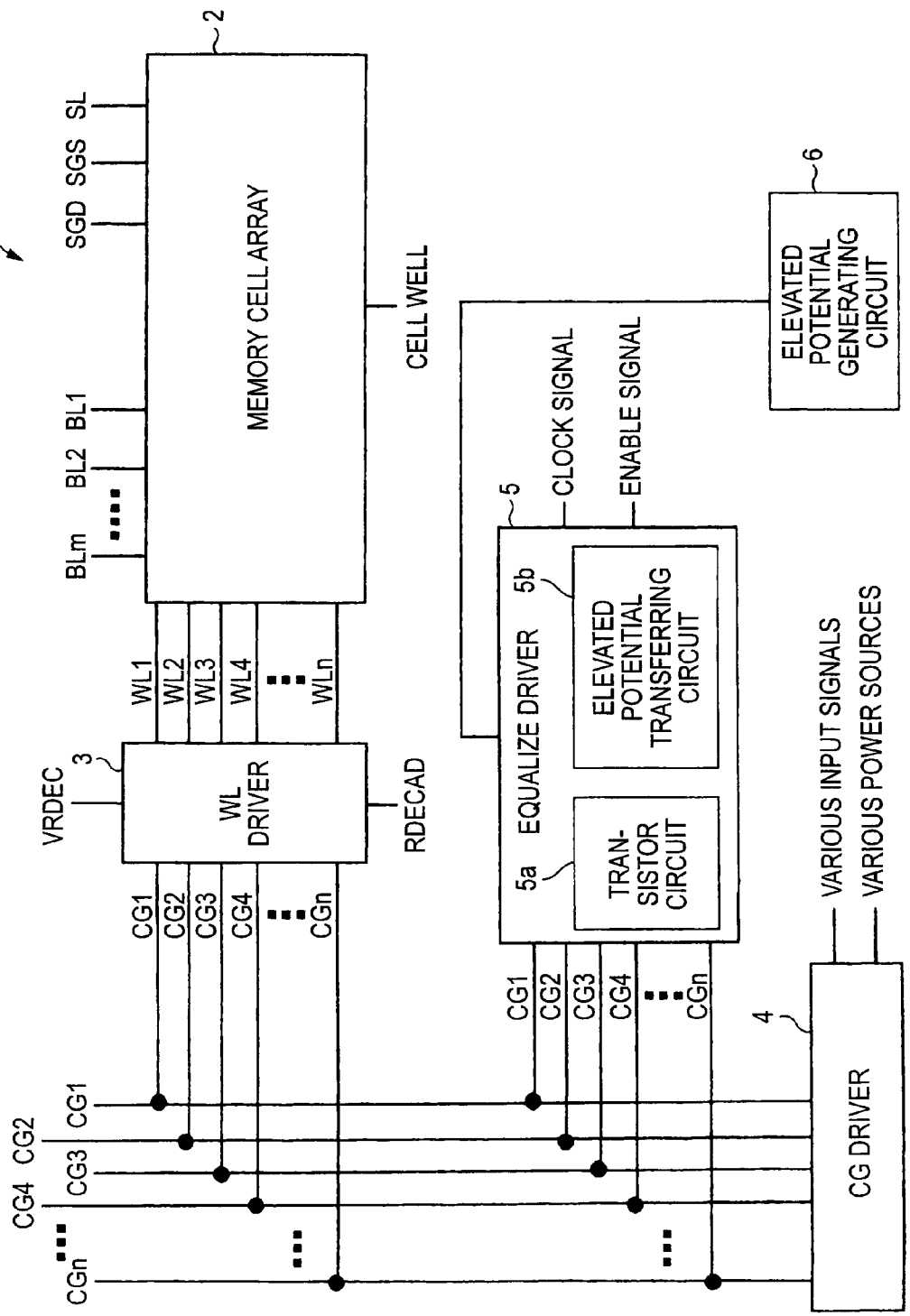
FIG. 1 is an exemplary view showing an outline constitution of an NAND type flash memory according to Embodiment 1 of the invention.

FIG. 1 is a diagram showing an outline constitution of a NAND type flash memory according to Embodiment 1 of the invention. As shown by FIG. 1, an NAND type flash memory 1 includes a memory cell array 2, a WL driver 3, a CG driver 4 and an equalize driver 5.

The memory cell array 2 includes a plurality of memory cell units connected in series with a plurality of memory cells (not illustrated), respective one end portions of the plurality of memory cell units are connected with bit lines BL1 through BLm by way of a drain side selecting gate transistor (not illustrated), and other end portions thereof are connected with a source line SL by way of a source side selecting gate transistor (not illustrated). A cell transistor having a two layers gate structure of a floating gate and a control gate is used for each memory cell. Control gates of the respective cell transistors are connected with word lines WL1 through WLn. Further, a gate terminal of the source side selecting gate transistor is connected with a source side selecting gate line SGS, and a gate terminal of the drain side selecting gate transistor is connected with a drain side selecting gate line SGD.

The WL driver 3 is constructed by a constitution similar to the constitution of a WL driver 200 shown in FIG. 16 mentioned above, an input stage thereof is connected with a plurality of control gate lines CG1 through CGn, and an output stage thereof is connected with the plurality of word lines WL1 through WLn, and the transfer transistors T1 through Tn are connected between the control gate lines CG1 through CGn and the word lines WL1 through WLn. Further, respective gate terminals of the transfer transistors T1 through Tn are connected with an external controller (not illustrated). The WL driver selects a word line WL connected to a cell transistor constituting an object of writing by summarizingly selectively making the transfer transistors T1 through Tn ON by VRDEC signal and RDECA signal inputted from the external controller (not illustrated).

The WL driver 3 selects the word line connected to a cell transistor constituting an object of writing in an operation of writing a data to the memory cell array 2, and transfers a write voltage Vpgm supplied from the CG driver 4 by way of the control gate line CG to the selected word line WL. A control gate of the cell transistor connected to the selected word line WL is applied with the write voltage Vpgm. Further, the WL driver 3 transfers a voltage Vpass supplied from the CG driver 4 by way of the control gate line CG to a nonselected word line WL in an operation of writing a data to the memory cell array 2. A control gate of the cell transistor connected to the nonselected word line WL is applied with the voltage Vpass.

Further, after finishing to write the data to the memory cell array 2, the WL driver 3 transfers a potential (about voltage Vpass) generated by shorting (short circuiting) all the control gate lines CG by a short circuiting operation of the equalize driver 5 mentioned later. That is, after finishing to write the data to the memory cell array 2, the all word lines WL1 through WLn are averaged to the same potential (about voltage Vpass) by shortcircuiting operation of the equalize driver 5.

The CG driver 4 is connected end portions of the control gate lines CG1 through CGn of a number the same as that of the word lines WL1 through WLn. The CG driver 4 is operated by various input signals and various power sources inputted from an external controller (not illustrated). The CG driver 4 supplies the write voltage Vpgm to the WL driver 3 by way of the control gate line CG in correspondence with the selected word line WL constituting the object of writing and supplies the voltage Vpass to the WL driver 3 by way of the control gate line CG in correspondence with the nonselected word line WL in the operation of writing the data.

The equalize driver (equalize portion) 5 is connected to end portions of the wirings CG1 through CGn formed by branching the control gate lines CG1 through CGn for connecting the WL driver 3 and the CG driver 4. The equalize driver 5 includes a transistor circuit (shortcircuiting) 5a having transistors of a number the same as that of the control gate lines CG1 through CGn for carrying out the above-described shortcircuiting operation, and an elevated potential transferring circuit (control signal generating circuit) 5b for generating an EQUALIZE signal for making the transistor of the transistor circuit ON. The equalize driver 5 is operated by a CLOCK signal and an ENABLE signal inputted from the external controller (not illustrated) and an elevated potential V1 supplied from an external elevated potential generating circuit 6. The elevated potential transferring circuit 5b generates the EQUALIZE signal from the elevated potential V1 supplied from the elevated potential generating circuit 6 to supply to the transistor circuit. The transistor circuit 5a shortcircuits all the control gate lines CG1 through CGn by making all the transistors ON by the EQUALIZE signal supplied from the elevated potential transferring circuit 5b. That is, in finishing the above-described writing operation, in order to shortcircuit (shortcircuit) all the word lines WL1 through WLn, the equalize driver 5 makes the transistor circuits ON and shortcircuits all the control gate lines CG1 through CGn and averages all the word lines WL1 through WLn to the same potential (about voltage Vpass).

The elevated potential V1 is set in consideration of the write voltage Vpgm applied to the selected word line WL and the voltage Vpass applied to the nonselected word line WL in the data writing operation. Specifically, as a voltage of operating the transistor circuit 5a in the equalize driver 5, a potential of about Vpass+Vth through Vpgm+Vth is set. Further, Vth is a threshold voltage for making the transistor in the transistor circuit 5a at inside of the equalize driver 5 ON. Further, in FIG. 1, the elevated potential generating circuit 6 is a circuit of generating the elevated potential V1 supplied to the elevated potential transferring circuit included in the equalize driver 5.

There are exemplified the elevated potential transferring circuits 5b included in the equalize driver 5 using a level shifter circuit and using a local pump circuit.

Figure 2:
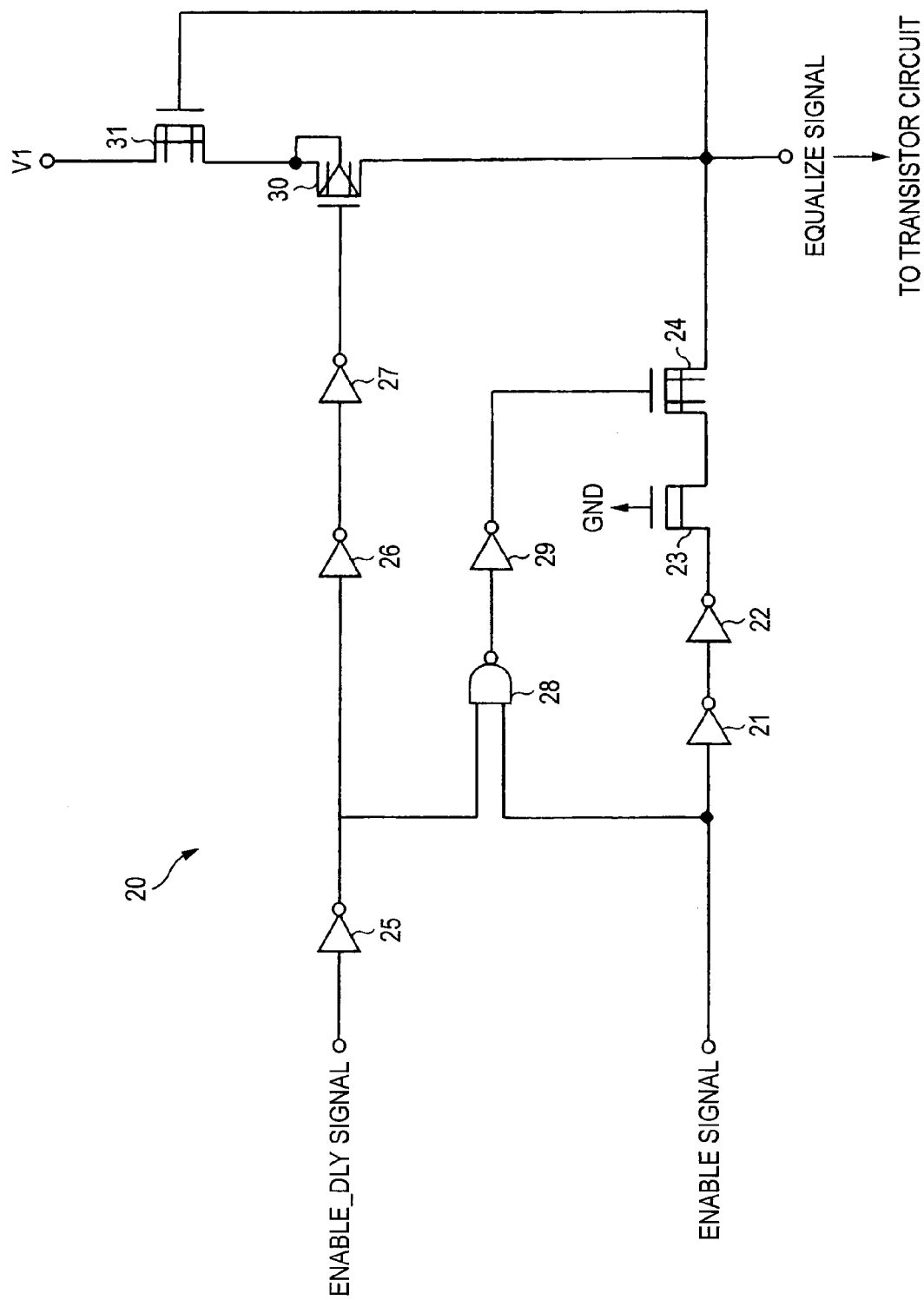
FIG. 2 is an exemplary view showing a constitution example of a level shifter circuit according to Embodiment 1 of the invention.

FIG. 2 shows a constitution example of a level shifter circuit 20 constituting the elevated potential transferring circuit 5b. The level shifter circuit 20 includes an inverter 21 connected to an input stage inputted with the ENABLE signal, an inverter 22 connected to an output stage of the inverter 21, a depression type NMOS transistor 23 a source terminal of which is connected to an output stage of the inverter 22, a high withstand voltage depression type NMOS transistor 24 a source terminal of which is connected to a drain terminal of the depression type NMOS transistor 23, an inverter 25 connected to an input stage inputted with an ENABLE_DLY signal generated from the ENABLE signal, an inverter 26 connected to an output stage of the inverter 25, an inverter 27 connected to an output stage of the inverter 26, an NAND circuit 28 connected to the input stage inputted with the ENABLE signal and the output stage of the inverter 21, an inverter 29 connected to an output stage of the NAND circuit 28, a high withstand voltage PMOS transistor 30 a gate terminal of which is connected to an output stage of the inverter 27, and a high withstand voltage depression type NMOS transistor 31 connected between a source terminal of the high withstand voltage PMOS transistor 30 and a voltage V1 input terminal.

The inverter 21 and the inverter 22 transmit the ENABLE signal inputted from an external controller (not illustrated) to a drain terminal of the depression type NMOS transistor 23.

The depression type NMOS transistor 23 is always brought into an ON state since a gate terminal thereof is connected to a ground GND, and transmits the ENABLE signal inputted to the drain terminal from the inverter 22 to a source terminal of the high withstand voltage depression type NMOS transistor 24.

The inverter 25 outputs an inverted ENABLE_DLY signal constituted by inverting an ENABLE_DLY signal generated at inside of the equalize driver 5 from the ENABLE signal inputted from the external controller (not illustrated) to the inverter 26.

The inverter 26 and the inverter 27 transmit the inverted ENABLE_DLY signal inputted from the inverter 25 to the gate terminal of the high withstand PMOS transistor 30.

The NAND circuit 28 is inputted with an inverted ENABLE_DLY signal at one input terminal thereof and inputted with the ENABLE signal at other input terminal thereof and outputs a result of an exclusive logical product of the inverted ENABLE_DLY signal and the ENABLE signal to the inverter 29.

The inverter 29 inverts the result of the exclusive logical product inputted from the NAND circuit 28 to transmit to a gate terminal of the high withstand voltage depression type NMOS transistor 24.

The drain terminal of the high withstand voltage depression type NMOS transistor 24 is connected with the equalize signal output terminal along with the drain terminal of the high withstand voltage PMOS transistor 30 and the gate terminal of the high withstand voltage depression type NMOS transistor 31. The high withstand NMOS transistor 24 is made ON when the result of the logical product inputted from the inverter 29 to the gate terminal is "Hi", and passes the ENABLE signal inputted from the depression type NMOS transistor 23.

The source terminal of the high withstand voltage depression type PMOS transistor 30 is connected to the source terminal of the high withstand voltage depression type NMOS transistor 31 and a substrate terminal of the high withstand voltage depression type PMOS transistor 30. The gate terminal of the high withstand voltage depression type NMOS transistor 31 is connected to the drain terminal of the high withstand voltage depression type NMOS transistor 24. The high withstand voltage depression type NMOS transistor 31 is made ON when the ENABLE signal passing the high withstand voltage depression type NMOS transistor 24 is "Hi", and transmits the elevated potential V1 inputted from the elevated potential generating circuit 6 to the source terminal to the source terminal of the high withstand voltage depression type PMOS transistor 30.

The high withstand voltage depression type PMOS transistor 30 is made ON when the inverted ENBALE_DLY signal inputted from the inverter 27 to the gate terminal is "Hi", and transmits the elevated potential V1 inputted to the source terminal from the drain terminal to the transistor circuit 5a as the EQUALIZE signal.

Next, an operation of the level shifter circuit 20 shown in FIG. 2 will be explained in reference to a timing chart shown in FIG. 3.

Figure 3:
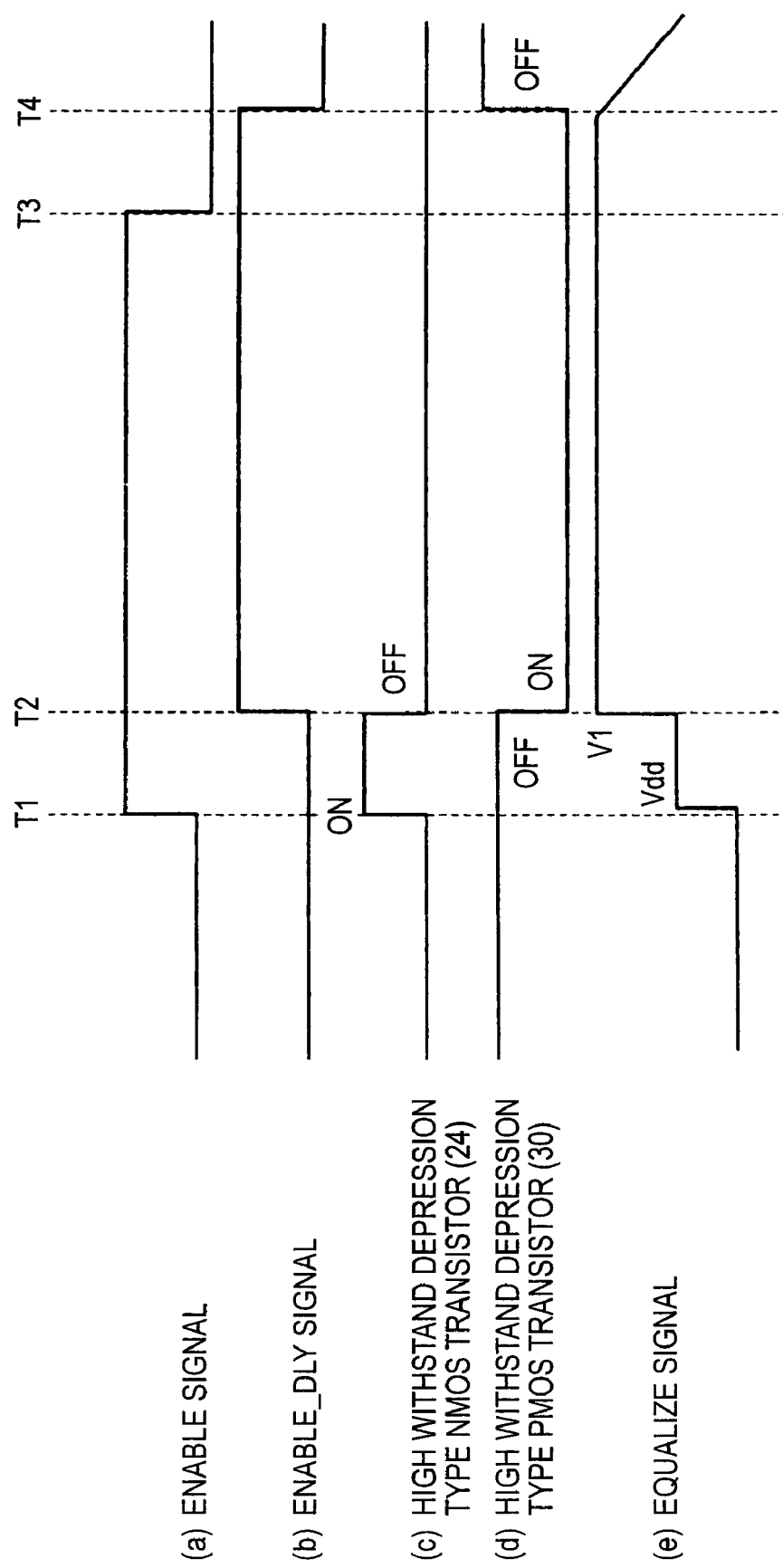
FIG. 3 is an exemplary timing chart respectively showing (a) an operation of an ENABLE signal, (b) an operation of an ENABLE_DLY signal, (c) an operation of a high withstand voltage PMOS transistor, (d) an operation of a high withstand depression type PMOS transistor, and (e) an operation of an EQUALIZE signal in the level shifter circuit according to Embodiment 1 of the invention.

In FIG. 3, (a) is a timing chart showing an operation of the ENABLE signal, (b) is a timing chart showing an operation of the ENABLE_DLY signal, (c) is a timing chart showing an operation of the high withstand voltage depression type NMOS transistor 24, (d) is a timing chart showing the high withstand voltage depression type PMOS transistor 30, and (e) is a timing chart showing an operation of the EQUALIZE signal, respectively.

According to the level shifter circuit 20, at timing of T1, when the ENABLE signal inputted from the external controller is "Hi", (refer to FIG. 3(a)), the gate terminal of the high withstand voltage depression type NMOS transistor 24 is inputted with "Hi", and the high withstand voltage depression type NMOS transistor 24 is made ON (refer to FIG. 3(c)). At this occasion, the high withstand voltage depression type NMOS transistor 24 outputs the ENABLE signal inputted from the high withstand depression type NMOS transistor 23 to the source terminal from the drain terminal. Further, at timing T1, the ENABLE_DLY signal is "Low", and therefore, the gate terminal of the high withstand voltage depression type PMOS transistor 30 is inputted with "Low" of the inverted ENABLE_DLY signal by the inverters 25 through 27, and therefore, the high withstand voltage depression type PMOS transistor 30 is made OFF (refer to FIG. 3(d)).

Further, at timing T1, the gate terminal of the high withstand voltage depression type NMOS transistor 31 is inputted with the ENABLE signal "Hi", and therefore, the high withstand voltage depression type NMOS transistor 31 is made ON (refer to FIG. 3(e)). At this occasion, although the voltage V1 is inputted to the source terminal of the high withstand voltage depression type PMOS transistor 30, since the high withstand voltage depression type PMOS transistor 30 is made OFF, the EQUALIZE signal outputted from the EQUALIZE signal output terminal becomes Vdd (refer to FIG. 3(e)).

Next, according to the level shifter circuit 20, at timing T2, when the ENABLE_DLY signal inputted from the external controller is "Hi" (refer to FIG. 3(b)), the gate terminal of the high withstand voltage depression type NMOS transistor 24 is inputted with "Low", and the high withstand voltage depression type NMOS transistor 24 is made OFF (refer to FIG. 3(c)). At this occasion, the inverted ENABLE_DLY signal inputted to the gate terminal of the high withstand voltage depression type PMOS transistor 30 becomes "Hi", and the high withstand voltage depression type PMOS transistor 30 is made ON (refer to FIG. 3(d)).

Further, at timing T2, the gate terminal of the high withstand voltage depression type NMOS transistor 31 is successively inputted with the ENABLE signal "Hi", and therefore, the high withstand voltage depression type NMOS transistor 31 is maintains an ON state (refer to FIG. 3(e)). At this occasion, the elevated potential V1 is inputted to the source terminal of the high withstand voltage depression type PMOS transistor 30, and therefore, since the high withstand voltage depression type PMOS transistor 30 is made ON, the EQUALIZE signal transferred from the EQUALIZE signal output terminal of the transistor circuit 5a becomes the elevated potential V1 (refer to FIG. 3(e)). That is, all the transistors at inside of the transistor circuit 5a is made ON by the elevated potential V1 to shortcircuit (shortcircuit) all the control gate lines CG1 through CGn. By the shortcircuiting operation, all the word lines WL connected to all the control gate lines CG1 through CGn are averaged to the same potential (about voltage Vpass).

Next, at timing T3, when the ENABLE signal becomes "Low" from "Hi" (refer to FIG. 3(a)), since the inverted ENABLE_DLY signal maintains "Hi" (refer to FIG. 3(b)), in the level shifter circuit 20, the high withstand voltage depression type NMOS transistor 24 is maintained to be OFF (refer to FIG. 3(c)). At this occasion, the high withstand voltage depression type PMOS transistor 30 is continued to be ON (refer to FIG. 3(d)), and the EQUALIZE signal is maintained to the elevated potential V1 (refer to FIG. 3(e)). That is, all the word lines WL are maintained to the same potential (about voltage Vpass).

Next, at timing T4, when the inverted ENABLE_DLY signal becomes "Low" from "Hi" (refer to FIG. 3(b)), the inverted ENABLE_DLY signal becomes "Low" from "Hi" and the high withstand voltage depression type PMOS transistor 30 is made OFF (refer to FIG. 3(d)). At this occasion, the gate terminal of the high withstand voltage depression type NMOS transistor 24 is made ON by being inputted with "Low" signal, and the gate terminal of the high withstand voltage depression type NMOS transistor 31 is inputted with the ENABLE signal "Low" to be OFF. Further, by gradually discharging the elevated potential of the EQUALIZE signal outputted from the output terminal of the EQUALIZE signal from V1, all the word lines WL are discharged to the discharge potential of the EQUALIZE signal (refer to FIG. 3(e)).

Figure 4:
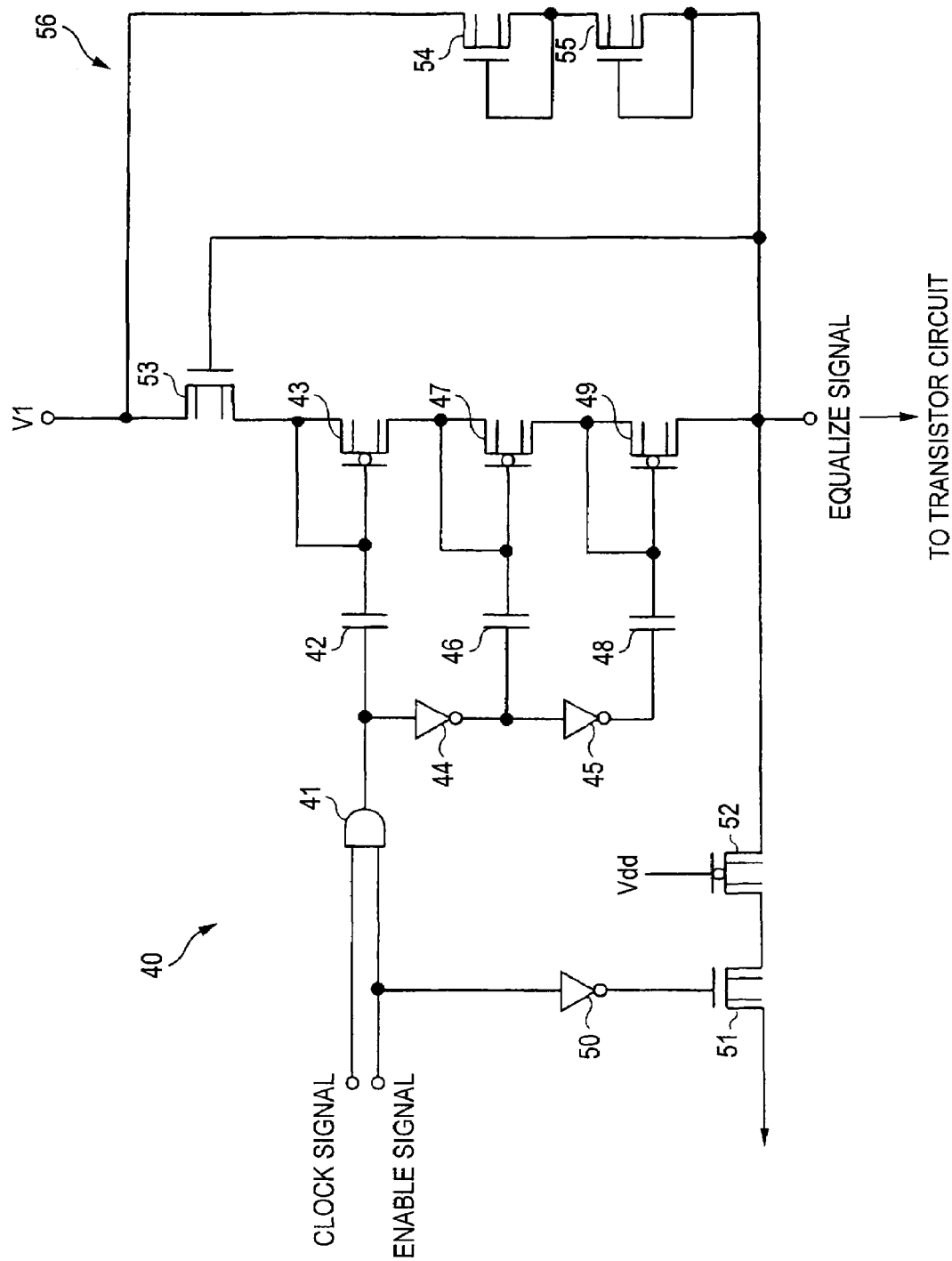
FIG. 4 is an exemplary view showing a constitution example of a local pump circuit according to Embodiment 1 of the invention.

Next, FIG. 4 shows a constitution example of a local pump circuit 40 constituting the elevated potential transferring circuit 5b. The local pump circuit 40 includes an AND circuit 41 connected to an input stage inputted with an ENABLE signal and a CLOCK signal, a high withstand voltage PMOS transistor 43 connected to an output stage of the AND circuit 41 by way of a capacitor 42, an inverter 44 branched to be connected to the output stage of the AND circuit 41, an inverted 45 connected to an output stage of the inverter 44, a high withstand voltage PMOS transistor 47 connected to an output stage of the inverter 44 by way of a capacitor 46, a high withstand voltage PMOS transistor 49 connected to an output stage of the inverter 45 by way of a capacitor 48, an inverter 50 branched to be connected to the input stage inputted with the ENABLE signal, a high withstand voltage NMOS transistor 51 a gate terminal of which is connected to an output stage of the inverter 50, a high withstand voltage PMOS transistor 52 a source terminal of which is connected to a drain terminal of the high withstand voltage NMOS transistor 51, a high withstand voltage NMOS transistor 53 connected between the source terminal of the high withstand voltage PMOS transistor 43 and an input terminal of the voltage V1, a high withstand voltage NMOS transistor 54 a drain terminal of which is branched to be connected with the input terminal of the voltage V1, and a high withstand voltage NMOS transistor 55 a source terminal of which is connected to a drain terminal of the high withstand PMOS transistor 54.

The AND circuit 41 is inputted with the CLOCK signal from an external controller (not illustrated) at one input terminal and inputted with the ENABLE signal from an external controller (not illustrated) at other input terminal. The AND circuit 41 transmits the CLOCK signal to a later stage when the ENABLE is "Hi".

The high withstand voltage PMOS transistors 43, 47 and 49 constitute diodes in a forward direction to outputs of the respective capacitors 42, 46 and 48 since gate terminals and source terminals thereof are connected thereto. The high withstand voltage PMOS transistors 43, 47, 49 and the high withstand voltage NMOS transistor 53 constitute a positive feedback voltage elevating circuit 56. The voltage elevating circuit 56 gradually elevates a potential of the EQUALIZE signal by the voltage V1 inputted from the high withstand NMOS transistor 53 when the ENABLE signal is "Hi".

The inverter 50 inverts the ENABLE signal and transmits the inverted ENABLE signal to the gate terminal of the high voltage NMOS transistor 51.

The source terminal of the high withstand voltage NMOS transistor 51 is connected to ground potential, and a drain terminal thereof is connected to a source terminal of the high withstand voltage PMOS transistor 52. The high withstand voltage NMOS transistor 51 is made ON when the inverted ENABLE signal inputted from the inverter 50 is "Low" (ENABLE signal is "Hi") and transmits the inverted ENABLE signal to the source terminal of the high withstand voltage PMOS transistor 52.

A gate terminal of the high withstand voltage PMOS transistor 52 is connected to Vdd and a drain terminal thereof connected to an output terminal of the EQUALIZE signal along with a drain terminal of the high withstand voltage PMOS transistor 49, a gate terminal of the high withstand voltage depression NMOS transistor 53 and a drain terminal of the high withstand voltage depression type NMOS transistor 55. The high withstand voltage PMOS transistor 52 is always brought into an ON state since a gate terminal thereof is connected to Vdd, and passes the inverted ENABLE signal from the high withstand voltage PMOS transistor 51.

The high withstand voltage NMOS transistor 53 is made ON when the inverted ENABLE signal passing the high withstand voltage PMOS transistor 52 is "Hi", and transmits the voltage V1 inputted to the source terminal to the source terminal of the high withstand voltage PMOS transistor 43.

The high withstand voltage NMOS transistors 54 and 55 are made ON when a potential of the elevated voltage outputted from the voltage elevating circuit exceeds the voltage V1 and sets the elevated potential outputted from the output terminal of the EQUALIZE signal to a potential equal or higher than V1 or lower. The high withstand voltage PMOS transistors 54 and 55 functions as a voltage limiter.

Next, an operation of the local pump circuit 40 shown in FIG. 4 will be explained in reference to a timing chart shown in FIG. 5.

Figure 5:
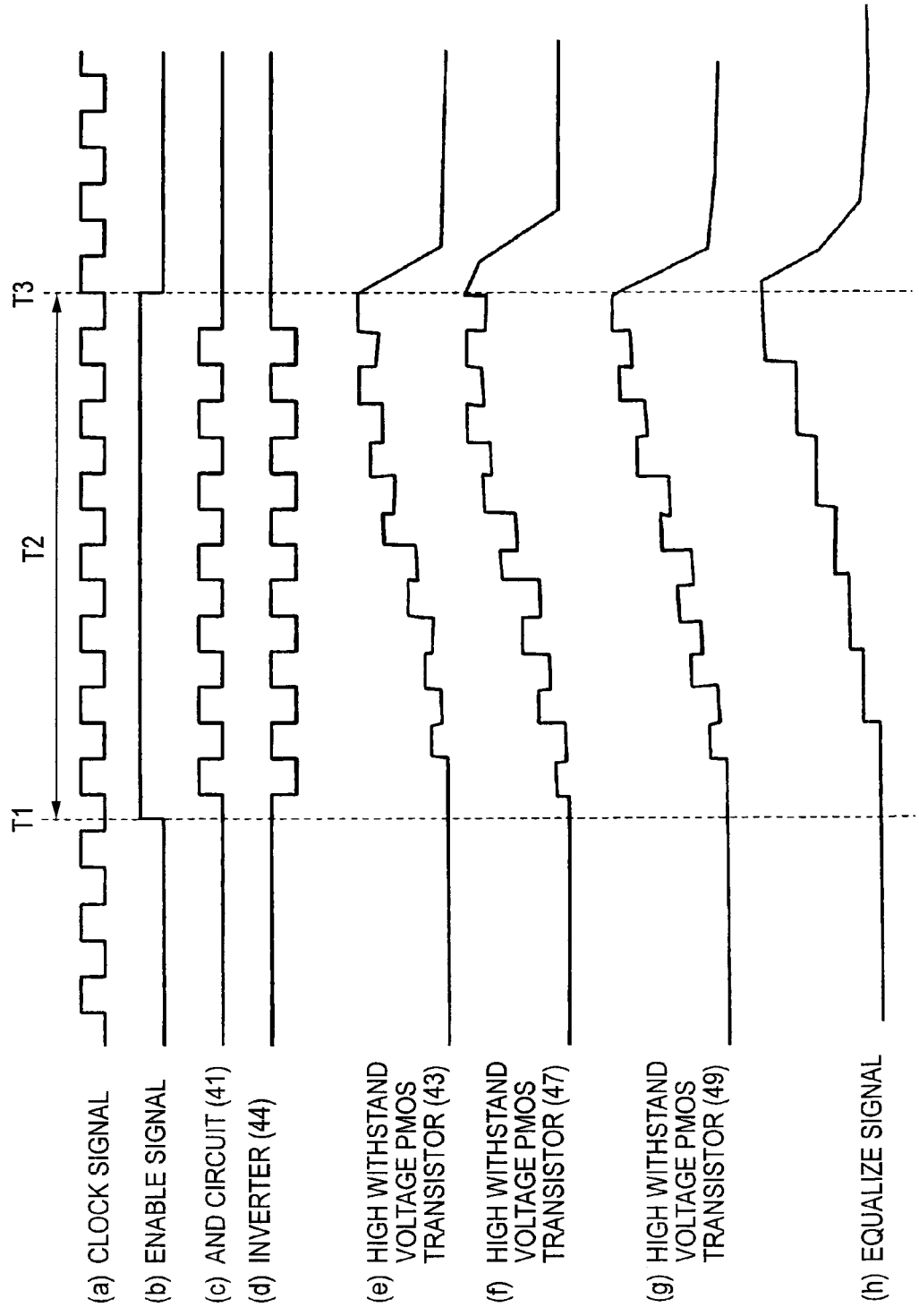
FIG. 5 is an exemplary timing chart respectively showing (a) an operation of a source side selecting gate line SGS, (b) an operation of a drain side selecting gate line SGD, (c) an operation of a nonselected word line WL, (d) an operation of a selected word line WL, and (e) an operation of an EQUALIZE signal in the local pump circuit according to Embodiment 1 of the invention.

In FIG. 5, (a) is a timing chart showing an operation of the CLOCK signal, (b) is a timing chart showing an operation of ENABLE signal, (c) is a timing chart showing an operation of the AND circuit 41, (d) is a timing chart showing an operation of the inverter 44, (e) is a timing chart showing an operation of the high withstand voltage PMOS transistor 43, (f) is a timing chart showing an operation of the high withstand voltage PMOS transistor 47, (g) is a timing chart showing an operation of the high withstand voltage PMOS transistor 49, and (h) is a timing chart showing an operation of the EQUALIZE signal, respectively.

The local pump circuit 40 is inputted with the CLOCK signal from the external controller (refer to FIG. 5(a)). At timing T1 in the drawing, when the ENABLE signal inputted from the external controller is "Hi" (refer to FIG. 5(b)), the CLOCK signal is outputted from the AND circuit 41 (refer to FIG. 5(c)). At this occasion, the inverted ENABLE signal "Low" is outputted from the inverter 50 to the gate terminal of the high withstand voltage NMOS transistor 51, the high withstand voltage NMOS transistor 51 is made ON, and the inverted ENABLE signal "Low" is transmitted to the high withstand voltage PMOS transistor 52. The high withstand voltage PMOS transistor 52 is made ON by the voltage Vdd always supplied to the gate terminal, and the inverted ENABLE signal "Low" transmitted from the high withstand voltage NMOS transistor 51 is transmitted to the gate terminal of the high withstand voltage NMOS transistor 53. The high withstand voltage NMOS transistor 53 is made ON by inputting the inverted ENABLE signal "Low" to the gate terminal and transmits the voltage V1 to the source terminal of the high withstand voltage PMOS transistor 43.

Further, the CLOCK signal outputted from the AND circuit 41 is transmitted to the gate terminal of the high withstand voltage PMOS transistor 43 by way of the capacitor 42 and inputted to the inverter 44. The inverter 44 transmits the inverted CLOCK signal to the capacitor 46 and the inverter 45 (refer to FIG. 5(d)).

The withstand voltage PMOS transistor 43 is transmitted with the CLOCK signal by being delayed by an operation of charging the capacitor 42. Further, the high withstand voltage PMOS transistor 43 transmits the potential of the CLOCK signal to the high withstand voltage PMOS transistor 47 while elevating the potential of the CLOCK signal by the elevated potential V1 transmitted from the high withstand voltage NMOS transistor 53 (refer to FIG. 5(e)).

The inverted CLOCK signal outputted from the inverter 44 is transmitted to the gate terminal of the high withstand voltage PMOS transistor 47 by being delayed by an operation of charging the capacitor 46. The high withstand voltage PMOS transistor 47 transmits the potential of the CLOCK signal to the high withstand voltage PMOS transistor 49 while further elevating the potential of the CLOCK signal transmitted from the high withstand voltage PMOS transistor 43 (refer to FIG. 5(f)).

The CLOCK signal outputted from the inverter 45 is transmitted to the gate terminal of the high withstand voltage PMOS transistor 49 by being delayed by an operation of charging the capacitor 48. The high withstand voltage PMOS transistor 49 further elevates the potential of the CLOCK signal transmitted from the high withstand voltage PMOS transistor 47 (refer to FIG. 5(g)). By the voltage elevating operation of the high withstand voltage PMOS transistors 43, 47 and 49, the CLOCK signal is gradually elevated and the EQUALIZE signal shown in FIG. 5(h) is outputted (refer to FIG. 5(h)). At this occasion, the EQUALIZE signal transferred from the output terminal of the EQUALIZE signal to the transistor circuit 5a sets the elevated potential to be equal to or lower than the potential a little higher than V1 as a result of elevating the elevated potential V1.

That is, during a time period T2 in the drawing, the potential of the CLOCK signal is elevated by the voltage elevating operation of the voltage elevating circuit 56 comprising the high withstand voltage NMOS transistor 53 and the high withstand voltage PMOS transistors 43, 47 and 49, and the EQUALIZE signal set to be equal to or lower than the potential a little higher than the elevated potential V1 is transferred from the output terminal of the EQUALIZE signal to the transistor circuit 5a.

Further, when the potential of the EQUALIZE signal becomes higher than the inputted elevated potential V1, the high withstand voltage NMOS transistors 54 and 55 are made ON and the potential of the EQUALIZE signal is limited to the elevated potential. That is, all the transistors in the transistor circuit 5a are made ON by the EQUALIZE signal (about Vpass+Vth), and all the control gate lines CG1 through CGn are shortcircuited. By the short circuiting operation, all the word lines WL connected to all the control gate lines CG1 through CGn are averaged to the same potential (about voltage Vpass).

Next, at timing of T3, when the ENABLE signal becomes "Low" from "Hi" (refer to FIG. 5(b)), the output terminal of the CLOCK signal from the AND circuit 41 is stopped (refer to FIG. 5(c)), and the output of the inverted CLOCK signal from the inverter 44 is stopped (refer to FIG. 5(d)). Further, the ENABLE signal outputted from the inverter 50 becomes "Hi" from "Low" and the high withstand voltage NMOS transistor 51 is made OFF.

Further, the voltage elevating operation of the voltage elevating circuit 56 is stopped (refer to FIGS. 5(e) through (g)), and the potential of the EQUALIZE signal transferred from the output terminal of the EQUALIZE signal to the transistor circuit 5a is gradually discharged from V1, thereby, all the word lines WL are discharged from the same potential (about voltage Vpass) to a discharge potential (refer to FIG. 5(h)).

Next, an explanation will be given of an operation of the memory cell array 2 in accordance with operations of the level shifter circuit 20 and the local pump circuit 40 in reference to a timing chart shown in FIG. 6.

Figure 6:
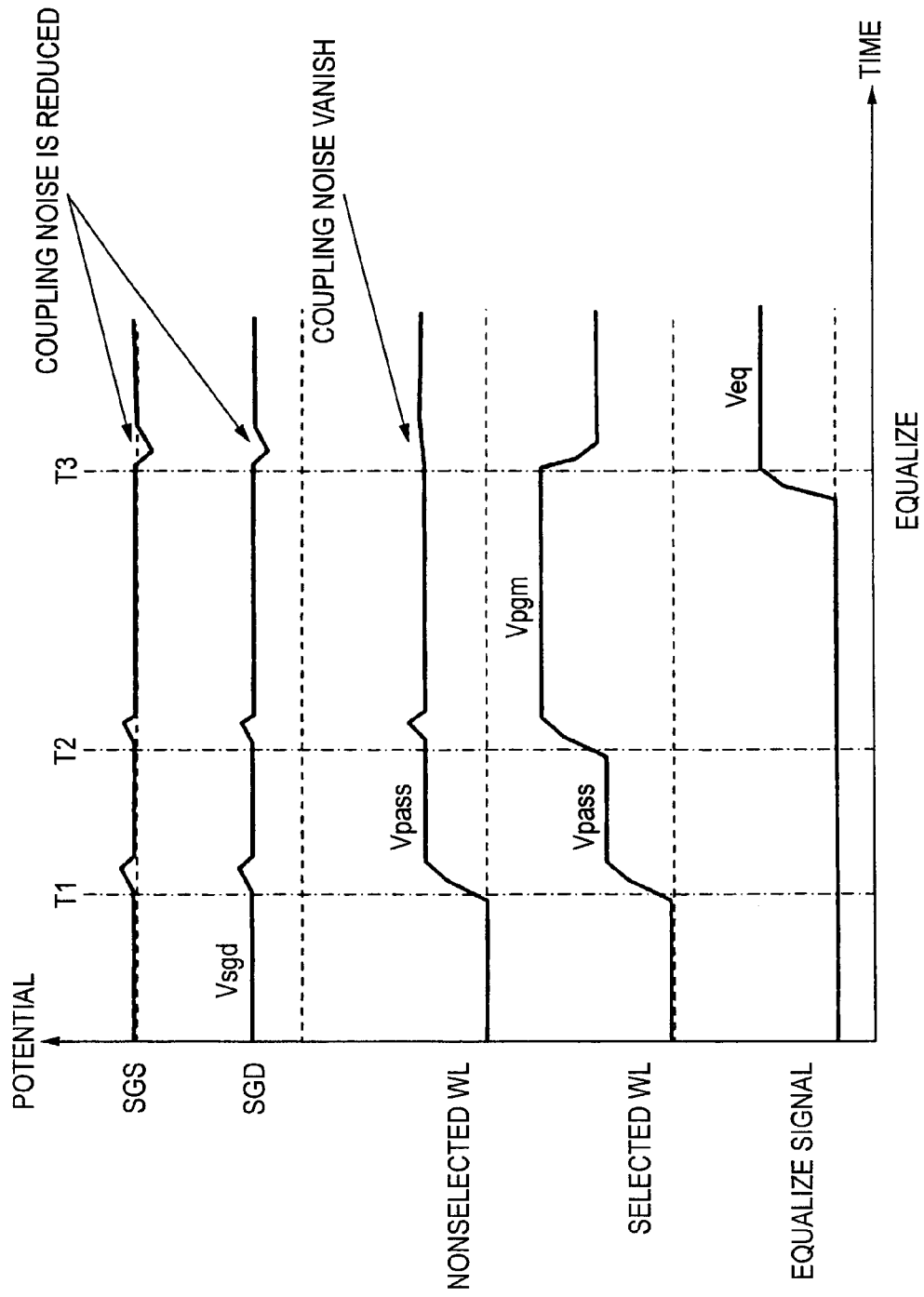
FIG. 6 is an exemplary timing chart showing respective operations of the source side selecting gate line SGS, the drain side selecting gate SGD, the nonselected word line WL, the selected word line WL and the EQUALIZE signal in a memory cell array according to Embodiment 1 of the invention.

FIG. 6 is a timing chart showing respective operations of the source side selecting gate line SGS, the drain side selecting gate line SGD, the nonselected word line WL, the selected word line WL, and the EQUALIZE signal in the memory cell array 2.

At timing T1 of FIG. 6, when writing a data to the memory cell array 2 is started, the word line WL connected to the cell transistor constituting the object of writing (referred to as selected word line WL) is selected by the WL driver 3. The selected word line WL is applied with a voltage Vpass by the CG driver 4. Further, the voltage Vpass is applied to the nonselected word line WL connected to the same transistor which does not constitute the object of writing by the CG driver 4.

Next, at timing T2, the selected word line WL is applied with the write voltage Vpgm by the CG driver 4. Next, the data is finished to be written to the cell transistor constituting the object of writing to shift to timing T3. At timing T3, write voltage Vpgm is started to be discharged. At this occasion, when the level shifter circuit 20 or the local pump circuit 40 is applied as the equalize driver 5, all the word lines WL are shortcircuited by making all the transistors in the transistor circuit 5a ON by the elevated potential transferring operation shown in FIG. 3 or FIG. 5.

Next, as a result of the discharging operation by the equalize driver 5, the write voltage Vpgm applied to the selected word line WL at timing T2 shown in FIG. 6 is discharged to a potential the same as the voltage Vpass applied to the nonselected word line WL (timing T3 in the drawing). As a result, as shown by FIG. 6, a potential difference between the selected word line WL and the nonselected word line WL contiguous thereto immediately after finishing the writing operation is reduced, and coupling noise at the nonselected word line WL contiguous to the selected word line WL is stopped from being brought about. Further, occurrence of the coupling noise is reduced at the source side selecting gate line SGS or the drain side selecting gate line SGD contiguous to the selected word line WL.

Figure 7:
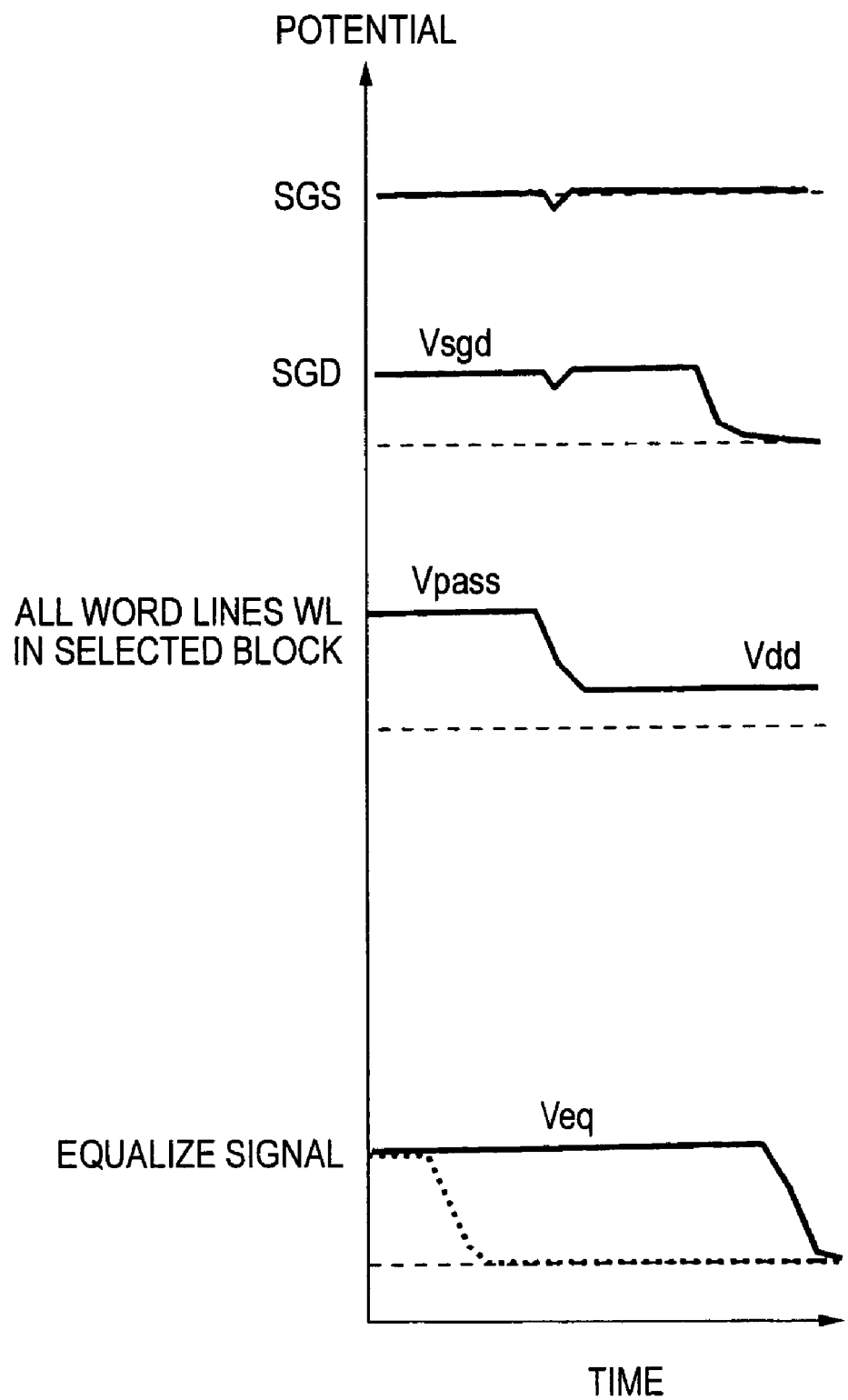
FIG. 7 is an exemplary timing chart showing respective operations of the source side selecting gate line SGS, the drain side selecting gate line SGD, all the word lines SG at inside of a selected block, and the EQUALIZE signal in the memory cell array according to Embodiment 1 of the invention.

Next, an operation will be given of an operation when the level shifter circuit 20 is applied as the equalize driver 5 in an operation of discharging a write voltage Vpgm in reference to a timing chart shown in FIG. 7. FIG. 7 is a timing chart showing respective operations of the source side selecting gate line SGS, the drain side selecting gate line SGD, all the word lines WL in the selected block, and the EQUALIZE signal at the memory cell array 2.

In FIG. 7, after averaging all the word lines WL in the selected block to the same potential (about voltage Vpass) by the shortcircuiting operation of the level shifter circuit 20 or the local circuit 40, the discharging operation is started in all the word lines WL. The EQUALIZE signal in the drawing shows a case that the potential is Veq (about Vpass+Vth). Further, in the case of the drawing, there is shown an example of discharging the voltage Vpass of all the word lines WL at inside of the selected block to Vdd.

After shortcircuiting operation of the transistor circuit 5a at inside of the equalize driver 5, the operation of natural discharging all the word lines WL is started. By the natural discharging operation, the potential of all the word lines WL is discharged from Vpass to Vdd. By the discharging operation, occurrence of a coupling noise is reduced at the source side selecting gate line SGS or the drain side selecting gate line SGD at inside of the selected block.

Further, the operation of discharging the EQUALIZE signal may be constituted by a case of a bold line or by a case of a broken line shown in FIG. 7.

As described above, the NAND type flash memory 1 according to the embodiment 1 is provided with the equalize driver 5 (to which the transistor circuit 5a and the level shifter circuit 20 of the local pump circuit 40 is applied) for carrying out the shortcircuiting operation for making the write voltage Vpg applied to the selected word line WL and the voltage Vpass applied to the nonselected word line WL the same potential after writing the data to the selected block at inside of the memory cell array 2. By the equalize driver 5, occurrence of the coupling noise at the nonselected word line WL contiguous to the selected word line WL in accordance with discharging the write voltage Vpgm of the selected word line WL is eliminated and occurrence of the coupling noise at the source side selecting gate line SGS or the drain side selecting gate line SGD contiguous thereto is reduced.

Therefore, a possibility that the NMOS transistor at inside of the WL driver 3 connected to the nonselected word line WL contiguous to the selected word line WL brings about an erroneous operation is reduced. As a result, a reliability of the NAND type flash memory is promoted.

The memory cell may be a floating gate type memory cell as shown in U.S. Pat. No. 7,099,193, the entire contents of which are incorporated by reference herein. Also, the structure of the memory cell array is shown in U.S. Pat. No. 7,099,193.

Further, the memory cell may be a MONOS type memory cell as shown in U.S. Pat. No. 6,917,072, the entire contents of which are incorporated by reference herein.

Embodiment 2

According to Embodiment 2, an explanation will be given of a case in which after all the word lines WL after writing the data by the equalize driver 5 shown in Embodiment 1 are shortcircuited to be averaged to the same potential, the potential of all the word lines WL at inside of the selected block is slowly discharged to Vdd by a constant current slower than the natural discharging.

Figure 8:
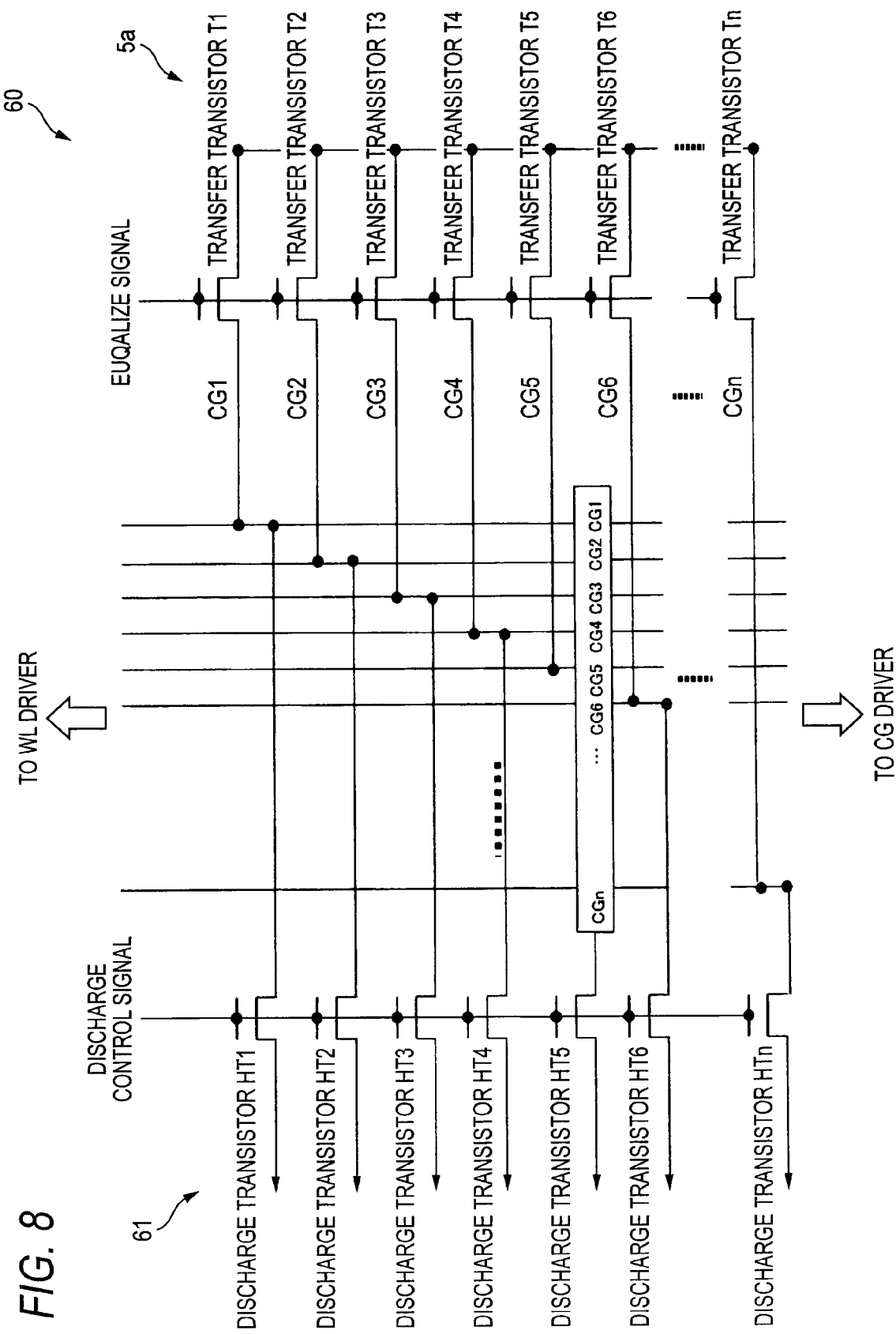
FIG. 8 is an exemplary view showing an example of a discharging circuit for discharging a potential of all the word lines WL according to Embodiment 2 of the invention slowly by a constant current.

FIG. 8 is a view showing an example of a discharging circuit for discharging the potential of the all the word lines WL to Vdd slowly by a constant current.

In FIG. 8, the NAND type flash memory 60 includes a plurality of NMOS transfer transistors T1 through Tn connected respectively to the word lines WL, and a plurality of NMOS discharge transistors HT1 through HTn respectively connected to the word lines WL. The plurality of NMOS discharge transistors T1 through Tn constitute a discharging circuit 61. The plurality of word lines WL are connected to a WL driver, not illustrated, (upper side of the drawing) and connected to a CG driver, not illustrated, (lower side of the drawing). Further, the NMOS transfer transistors T1 through Tn constitute the transistor circuit 5a included in the equalize driver 5.

The NMOS transfer transistors T1 through Tn are constituted by a number the same as a number of pieces of the control gate lines CG1 through CGn, respective gate terminals thereof are commonly connected to the output terminal of the EQUALIZE signal of the elevated voltage transferring circuit 5b included in the equalize driver 5, respective source terminals thereof are connected to the respective control gate lines CG1 through CGn, and respective drain terminals thereof are commonly connected to a power source line (not illustrated). The NMOS transfer transistors T1 through Tn are made ON in accordance with the potential of the EQUALIZE signal inputted to the gate terminals to shortcircuit all the word lines WL.

The NMOS discharge transistors HT1 through HTn of the discharging circuit 61 are constituted by a number the same as a number of pieces of the word lines WL, respective gate terminals thereof are connected to respective discharge control signal lines of an external controller, not illustrated, respective drain terminals thereof are connected to a ground potential, and respective source terminals thereof are connected to the respective word lines WL. The NMOS discharge transistors HT1 through HTn are respectively operated in accordance with discharge control signals inputted to the respective gate terminals and individually control discharging operations of the respective word lines WL.

Figure 9:
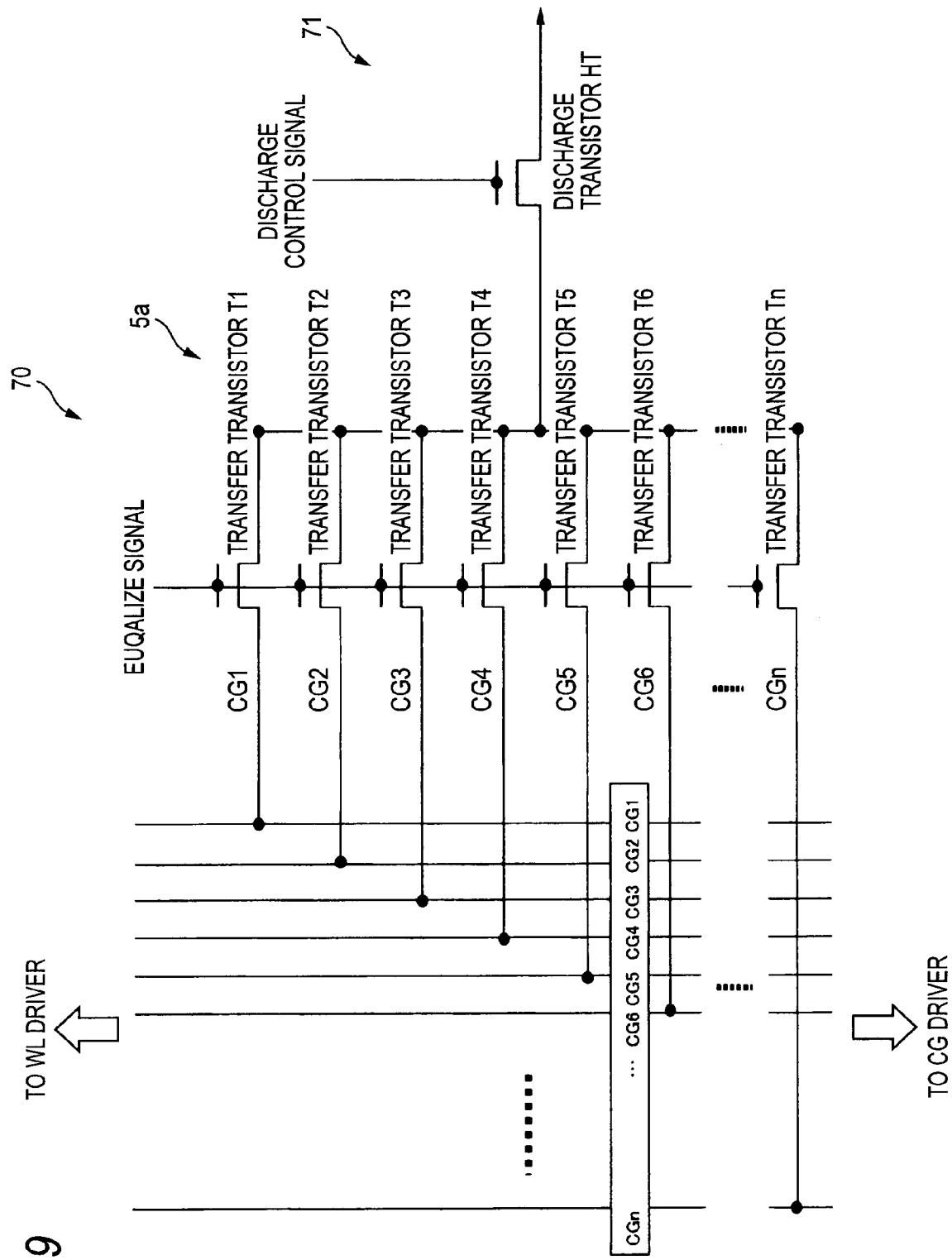
FIG. 9 is an exemplary view showing other example of a discharging circuit for discharging the potential of all the word lines WL according to Embodiment 2 of the invention slowly by a constant current.

Next, FIG. 9 shows other example of a discharging circuit for discharging the potential of all the word lines WL to Vdd slowly by a constant current.

In FIG. 9, an NAND type flash memory 70 includes a plurality of NMOS transfer transistors T1 through Tn respectively connected to the word lines WL, and an NMOS discharge transistor HT a drain terminal of which is connected to a commonly connected drain terminals of the NMOS transfer transistors T1 through Tn. The NMOS discharge transistor HT constitutes a discharging circuit 71. A plurality of word lines WL is connected to a WL driver, not illustrated, (upper side of the drawing) and connected to a CG driver, not illustrated, (lower side of the drawing). Further, the drain terminal commonly connected with the NMOS transfer transistors T1 through Tn is connected to a power source line (not illustrated). Further, the NMOS transfer transistors T1 through Tn in the drawing constitute the transistor circuit 5a included in the equalize driver 5. The NMOS transfer transistors T1 through Tn are constituted by a number the same a number of pieces of the control gate lines CG1 through CGn. The operation of the NMOS transfer transistors T1 through Tn is similar to that of FIG. 8.

In the NMOS discharge transistor HT of the discharging circuit 71, a gate terminal thereof is connected to a discharge control signal line of the external controller, not illustrated, and a source terminal thereof is connected to a ground potential. The NMOS discharge transistor HT is operated in accordance with a discharge control signal inputted to the gate terminal and controls operations of discharging all the word lines WL simultaneously.

Figure 10:
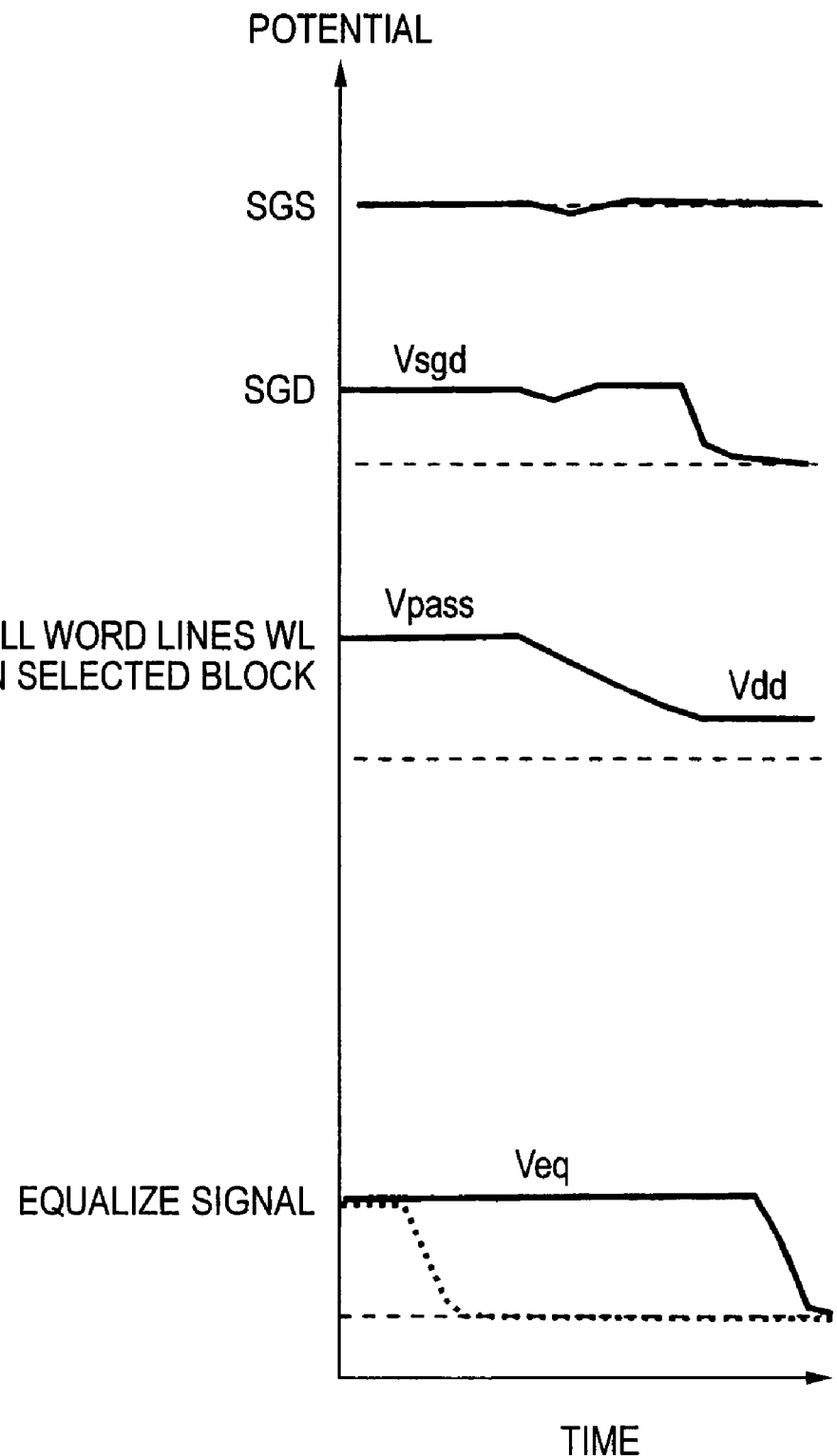
FIG. 10 is an exemplary timing chart showing respective operations of a source side selecting gate line SGS, a drain side selecting gate line SGD, all the word lines WL at inside of a selected block, and an EQUALIZE signal in a memory cell array according to Embodiment 2 of the invention.

Next, an explanation will be given of an operation when the equalize driver 5 and a discharging circuit 61 of FIG. 8 or a discharging circuit 71 of FIG. 9 are applied in an operation of discharging the write voltage Vpgm in reference to a timing chart shown in FIG. 10. FIG. 10 is a timing chart showing respective operations of the source side selecting gate line SGS, the drain side selecting gate line SGD, all the word lines WL in the selected block, and the EQUALIZE signal in the memory cell array 2.

In FIG. 10, by operating to shortcircuit the level shifter circuit 20 or the local pump circuit 40, and the transistor circuit 5a included in the equalize driver 5, all the word lines WL at inside of the selected block are averaged to the same potential (about voltage Vpass), thereafter, the discharging operation is started by the discharging circuit 61 of FIG. 8 or the discharging circuit 71 of FIG. 9. The EQUALIZE signal in the drawing shows a case that the potential is Veq (about Vpass+Vth). Further, in the case of the drawing, there is shown an example of discharging the voltage Vpass of all the word lines WL in the selected block to Vdd.

Next, when the discharging circuit 61 of FIG. 8 is applied, in a state of applying the EQUALIZE signal to the transfer transistors T1 through Tn, the NMOS discharge transistors HT1 through HTn connected to the respective control gate lines CG1 through CGn are made ON by the discharge control signal and the voltage Vpass of all the word lines WL are slowly discharged to Vdd. In this case, after releasing the EQUALIZE signal, the voltage Vpass may be discharged to Vdd by the NMOS discharge transistors HT1 through HTn.

Further, when the discharging circuit 71 of FIG. 9 is applied, in a state of applying the EQUALIZE signal to the transfer transistors T1 through Tn, the NMOS discharge transistor HT is made ON by the discharge control signal and the voltage Vpass of all the word lines WL is slowly discharged to Vdd.

Further, the operation of discharging the EQUALIZE signal may be constituted by a case of the bold line or the case of the broken line shown in FIG. 7.

As described above, according to Embodiment 2, after averaging all the word lines WL to the same potential (about voltage Vpass) by the shortcircuiting operation of the EQUALIZE driver 5, the voltage Vpass of all the word lines WL is slowly discharged to Vdd by the discharging circuit 61 of FIG. 8 or the discharging circuit 71 of FIG. 9. By the discharging operation, occurrence of the coupling noise at the nonselected word line WL, the source side selecting gate line SGS and the drain side selecting gate line SGD contiguous to the selected word line WL is further reduced. Therefore, a possibility that the NMOS transfer transistor at inside of the WL driver 3 connected to the nonselected word line WL, the source side selecting gate line SGS and the drain side selecting gate line SGD contiguous to the selected word line WL brings about an erroneous operation is reduced. As a result, a reliability of the NAND type flash memory is further promoted.

Embodiment 3

In Embodiment 3, an explanation will be given of a case in which all the word lines WL after having written the data are brought to the same potential by the shortcircuiting operation by the equalize driver 5 shown in Embodiment 1, thereafter, other word lines WL other than the word line WL contiguous to the source side selecting gate line SGS is slowly discharged to Vdd, and the word line WL contiguous to the source side selecting gate line SGS is slowly discharged to Vdd. Further, according to Embodiment 3, the level shifter circuit 20 shown in FIG. 2 or the local pump circuit 40 of FIG. 4 of Embodiment 1, and the discharging circuit 61 shown in FIG. 8 in Embodiment 2 are applied, and therefore, the explanation of illustrations and constitutions of the respective circuits will be omitted.

Next, an explanation will be given of an operation in a case of applying the discharge circuit 61 shown in FIG. 8 in the operation of discharging the write voltage Vpgm in reference to a timing chart shown in FIG. 11.

Figure 11:
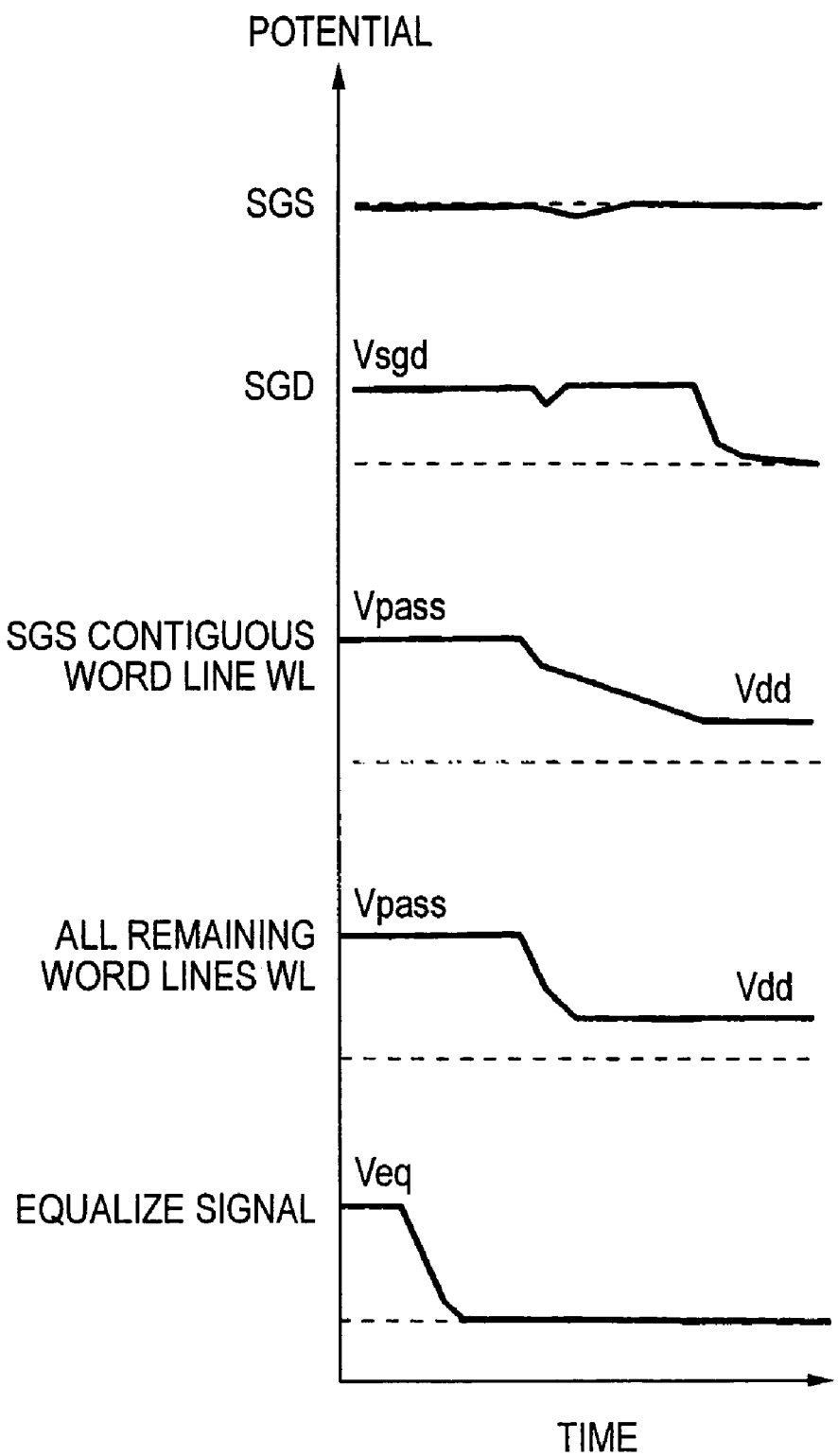
FIG. 11 is an exemplary timing chart showing respective operations of a source side selecting gate line SGS, a drain side selecting gate line SGD, a word line WL contiguous to the source side selecting gate line SGS, all the other word lines WL, and an EQUALIZE signal in a memory cell array according to Embodiment 3 of the invention.

FIG. 11 is a timing chart showing respective operations of the word line WL contiguous to the source side selecting gate line SGS, the drain side selecting gate line SGD, the source side selecting gate line SGS, all the other word lines WL, and the EQUALIZE signal in the memory cell array 2.

In FIG. 11, after averaging all the word lines WL at inside of the selected block to the same potential (about voltage Vpass) by the shortcircuiting operation of the elevated potential transferring circuit 5b (level shifter circuit 20 or local pump circuit 40) and the transistor circuit 5a included in the equalize driver 5, the discharging operation by the discharging circuit 61 shown in FIG. 8 is started. In this case, an example of discharging the voltage Vpass to Vdd will be shown.

Successively, in a state of applying the EQUALIZE signal to the transfer transistors T1 through Tn, in the discharging circuit 61 of FIG. 8, the respective NMOS discharge transistors HT connected to the control gate line CG in correspondence with other word line WL other than the word line WL contiguous to the source side selecting gate line SGS are made ON by the discharge control signal, and the voltage Vpass of the other word lines WL is slowly discharged to Vdd by a constant current.

Successively, the NMOS discharge transistor HT connected to the control gate line CG in correspondence with the word line WL contiguous to the source side selecting gate line SGS is made ON by the discharge control signal and the voltage Vpass of the contiguous word line WL is slowly discharged by a constant current to Vdd.

Further, an order of the discharging operation of the other word line WL and the discharging operation of the contiguous word line WL may be constituted by a reverse order or may be constituted simultaneously.

As described above, according to Embodiment 3, after averaging all the word lines WL to the same potential (voltage Vpass) by shortcircuiting all the word lines WL by the transistor circuit 5a and the level shifter circuit 20 or the local pump circuit 40 included in the EQUALIZE driver 5, the other word line WL other than the word line WL contiguous to the source side selecting gate line SGS is discharged to Vdd by the discharging circuit 61 of FIG. 8, and the word line WL contiguous to the source side selecting gate line SGS is slowly discharged to Vdd. By the discharging operation, occurrence of the coupling noise at the source side selecting gate line SGS contiguous to the selected word line WL is further reduced. Therefore, a possibility that the NMOS transfer transistor at inside of the WL driver 3 connected to the source side selecting gate line SGS contiguous to the selected word line WL brings about an erroneous operation is further reduced. As a result, the reliability of the NAND type flash memory is further promoted.

Figure 19:
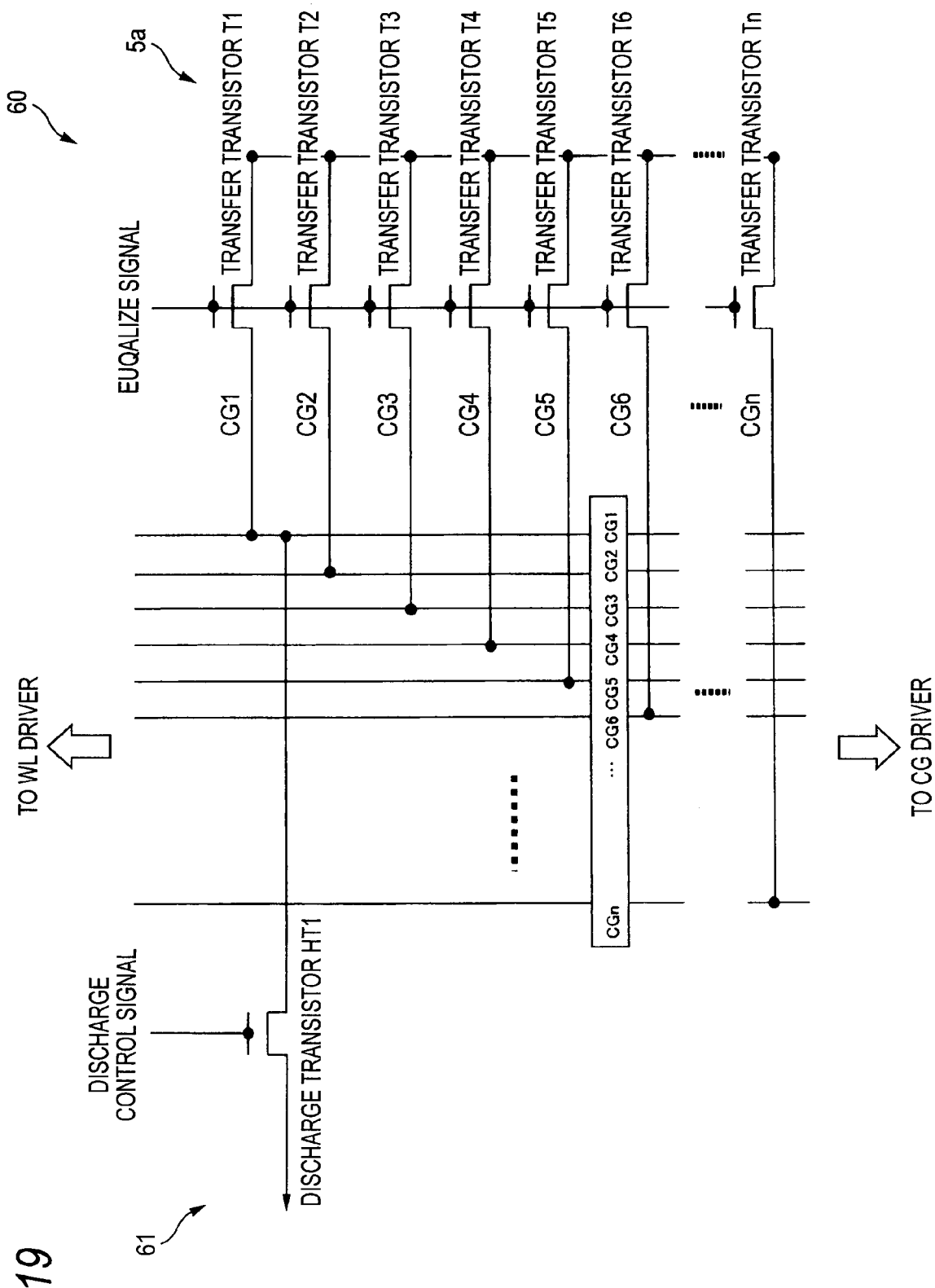
FIG. 19 is an exemplary view showing another example of a discharging circuit according to Embodiment 3 of the invention.

As shown in FIG. 19, the discharging circuit may be provided to one of the word lines adjacent to the source side selecting gate line SGS.

Embodiment 4

According to Embodiment 4, an explanation will be given of a case in which all the word lines WL after having written the data are averaged to the same potential by the shortcircuiting operation of the equalize driver 5 shown in Embodiment 1, thereafter, the potential of all the word lines WL is discharged slowly to Vdd. Further, according to Embodiment 4, the level shifter circuit 20 shown in FIG. 2 or the local pump circuit 40 of FIG. 4 of Embodiment 1 and the discharging circuit 61 shown in FIG. 8 of Embodiment 2 are applied, and therefore, an explanation of illustrations and constitutions of respective circuits will be omitted.

Next, an explanation will be given of an operation when the equalize driver 5 and the discharging circuit 61 shown in FIG. 8 are applied in the operation of discharging the write voltage Vpgm in reference to the timing chart shown in FIG. 12.

Figure 12:
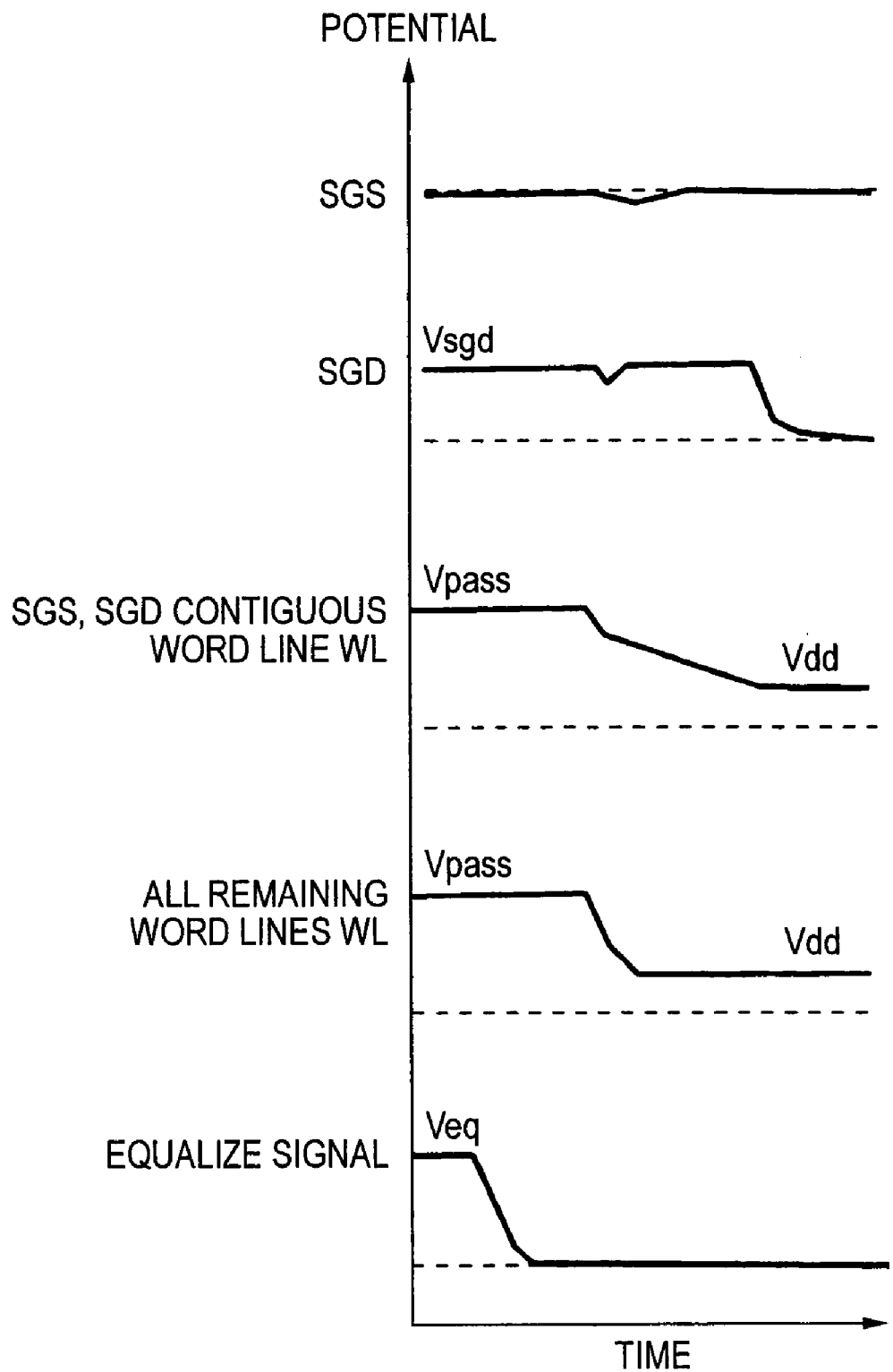
FIG. 12 is an exemplary timing chart showing respective operations of a source side selecting gate line SGS, a drain side selecting gate line SGD, a word line WL contiguous to the source side selecting gate line SGS and the drain side selecting gate line SGD, all the other word lines WL and an EQUALIZE signal in a memory cell array according to Embodiment 4 of the invention.

FIG. 12 is a timing chart showing respective operations of the source side selecting gate line SGS, the drain side selecting gate line SGD, the word line WL contiguous to the source side selecting gate line SGS and the drain side selecting gate line SGD, all the other word line WL and the EQUALIZE signal in the memory cell array 2.

In FIG. 11, by the shortcircuiting operation of the elevated potential transferring circuit 5*b* (level shifter circuit 20 or local pump circuit 40) and the transistor circuit 5*a* included in the equalize driver 5, all the word lines WL at inside of the selected block are averaged to the same potential (about voltage Vpass), thereafter, the discharging operation by the discharging circuit 61 shown in FIG. 8 is started. In this case, an example of discharging the voltage Vpass to Vdd will be shown.

Next, in a state of applying the EQUALIZE signal to the transfer transistors T1 through Tn, in the discharging circuit 61 of FIG. 8, all the NMOS discharge transistors HT connected to all the control gate lines CG in correspondence with all the word lines WL are made ON by the discharging control signal, and the voltage Vpass of all the word lines WL is discharged slowly by the constant current to Vdd.

As described above, according to Embodiment 4, after all the word lines WL are shortcircuited to be averaged to the same potential (voltage Vpass) by the transistor circuit 5*a* and the level shifter circuit 210 or the local pump circuit 40 included in the equalize driver 5, all the word lines WL are slowly discharged to Vdd by the discharging circuit 61 of FIG. 8. By the discharging operation, occurrence of the coupling noise at the source side selecting gate line SGS and the drain side selecting gate line SGD contiguous to the selected word line WL is further reduced. Therefore, a possibility that the NMOS transfer transistor at inside of the WL driver 3 connected to the source side selecting gate line SGS and the drain side selecting gate line SGD contiguous to the selected word line WL brings about an erroneous operation is further reduced. As a result, a reliability of the NAND type flash memory is further promoted.

Embodiment 5

According to Embodiment 5, an explanation will be given of an example of a discharge control circuit for slowly discharging the potential of the word line WL in the above-described embodiments 2 through 4. Further, according to Embodiment 5, the level shifter circuit 20 shown in FIG. 2 or the local pump circuit 40 of FIG. 4 of Embodiment 1 and the discharging circuit 61 of FIG. 8 or the discharging circuit 71 of FIG. 9 of Embodiment 2 is applied, and therefore, an explanation of illustrations and constitutions of respective circuits will be omitted.

Figure 20:
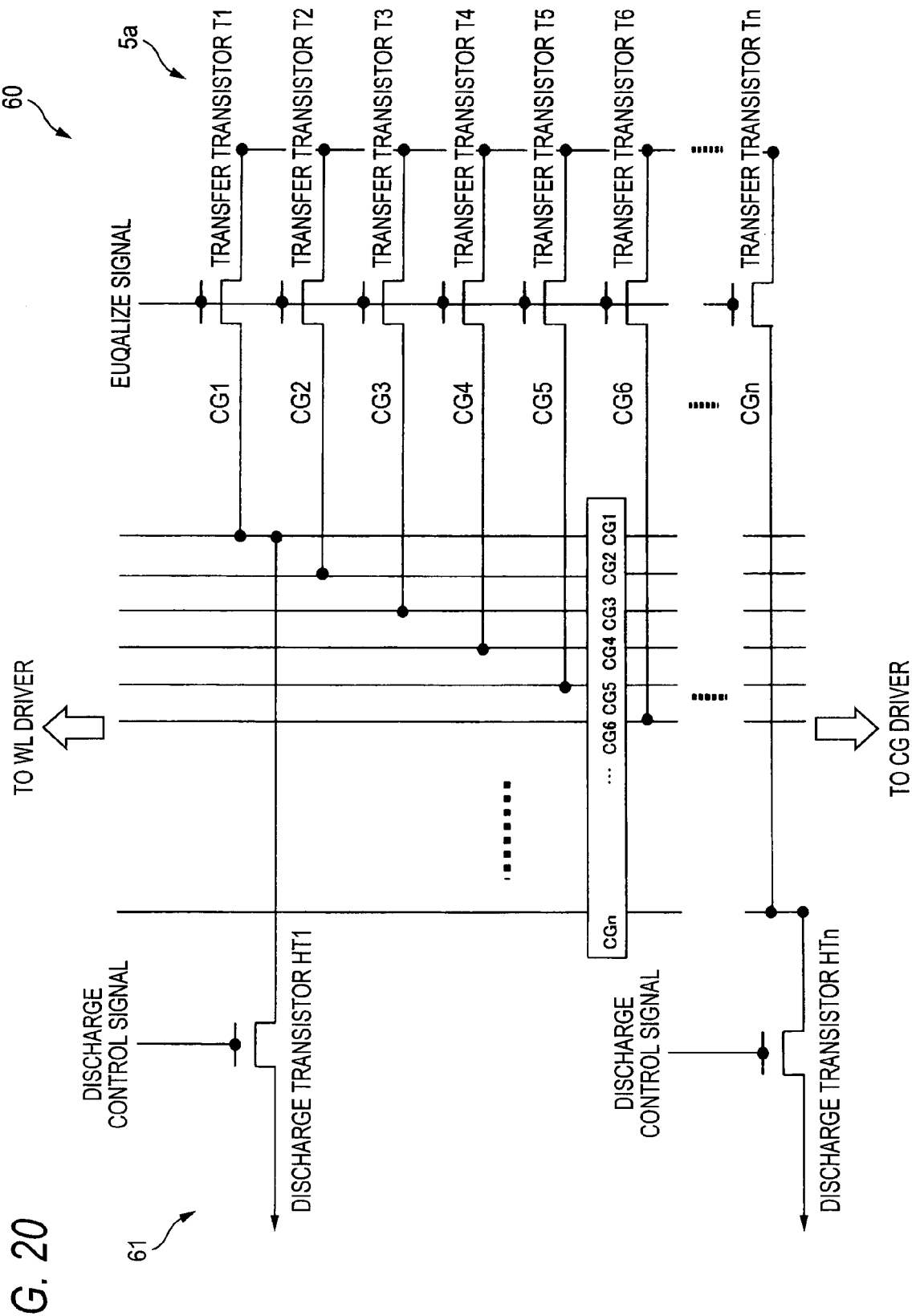
FIG. 20 is an exemplary view showing another example of a discharging circuit according to Embodiment 4 of the invention.

As shown in FIG. 20, the discharging circuit may be provided to one of the word lines adjacent to the source side selecting gate line SGS and another one of the word line adjacent to the drain side selecting gate line SGD.

Figure 13:
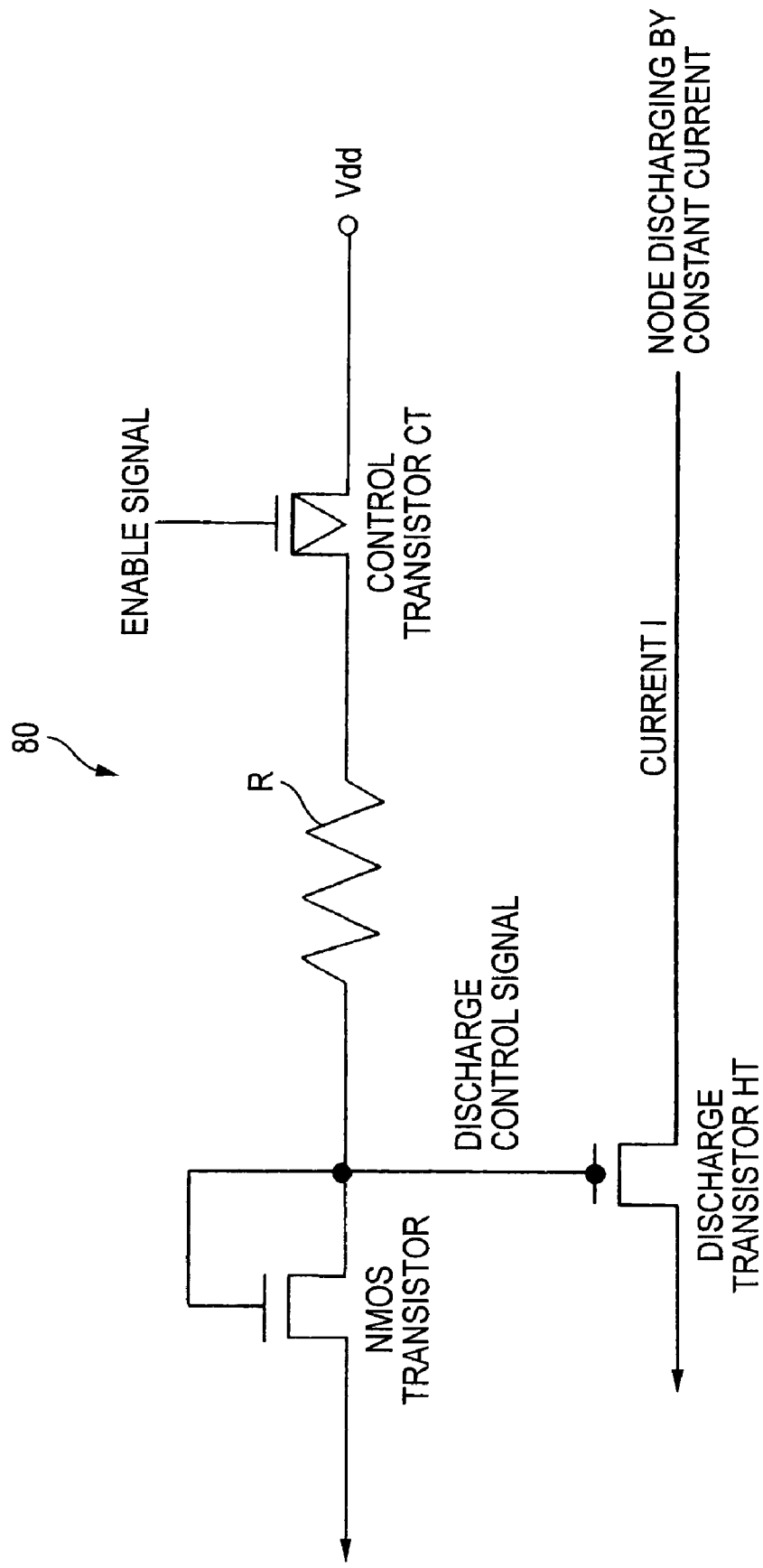
FIG. 13 is an exemplary view showing a discharge control circuit according to Embodiment 5 of the invention.

FIG. 13 is a diagram showing a constitution of a discharge control circuit 80 according to Embodiment 5. In FIG. 13, the discharge control circuit 80 includes a PMOS control transistor CT, a resistor R and an NMOS transistor.

The PMOS control transistor CT is connected to an ENABLE signal line of an external controller (not illustrated), a drain terminal thereof is connected to the power source Vdd, and a source terminal thereof is connected to the resistor R. The PMOS control transistor CT is made ON when the ENABLE signal is "Hi" and transmits the power source Vdd to the resistor R.

In the NMOS transistor, a gate terminal and the drain terminal thereof are connected, the drain terminal is connected to the resistor R, and a source terminal thereof is connected to a ground potential. The NMOS transistor divides the power source Vdd by an internal resistance r along with the resistor R and outputs the divided voltage to the gate terminal of the discharge transistor HT as the discharge control signal.

Figure 14:
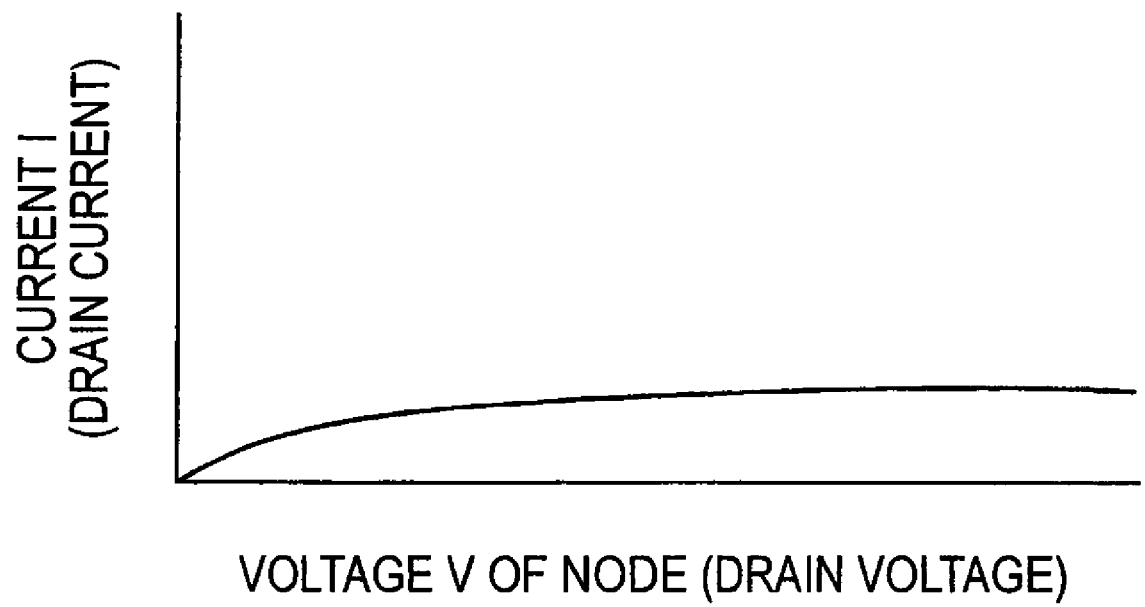
FIG. 14 is an exemplary view showing an operation of the discharge control circuit according to Embodiment 5 of the invention.

The discharge transistor HT is made ON by the discharge control signal inputted from the discharge control circuit 80 to the gate terminal and outputs a constant current I to a node connected with the source terminal and the control gate line CG. FIG. 14 shows a relationship between the current I and a voltage V of the node.

When the discharge control circuit 80 is applied to the discharge circuit 61 shown in FIG. 8, the discharge control circuit 80 is connected to the gate terminal of the discharge transistor HT.

By applying the discharge control circuit 80 to the discharging circuit 61 of FIG. 8 or the discharging circuit 71 of FIG. 9, when the voltage Vpass of the respective word lines WL is discharged to the voltage Vdd, the voltage Vpass is discharged slowly by the constant current I. Therefore, occurrence of the coupling noise at the nonselected word line WL, the source side selecting gate line SGS and the drain side selecting gate line SGD contiguous to the selected word line WL is further be reduced. Therefore, a possibility that the NMOS transfer transistor at inside of the WL driver 3 connected to the nonselected word line WL, the source side selecting gate line SGS or the drain side selecting gate line SGD contiguous to the selected word line WL brings about an erroneous operation is further reduced. As a result, a reliability of the NAND type flash memory is further promoted.

Further, the function of the discharge control circuit may be included in the CG driver 4.

What is claimed is:

1. A nonvolatile semiconductor memory device comprising:
a memory cell array having:
a cell string including a plurality of memory cells connected in series;
a plurality of word lines respectively connected to the plurality of memory cells;
a source side selecting gate connected to one end of the cell string; and
a drain side selecting gate connected to the other end of the cell string;
a word line selector that selects one of the word lines connected to a target memory cell to be written; and
an equalizing unit that equalizes voltages of the plurality of word lines after data write of the target memory cell is finished.

2. The memory device according to claim 1,
wherein the equalizing unit includes:
a shorting unit that shorts the plurality of word lines to equalize the voltages thereof after the data write is finished; and
a shorting controller that generates a control signal for controlling a shorting operation of the shorting unit.

3. The memory device according to claim 1, further comprising: a discharging circuit that discharges the voltages of the word lines after the voltages are equalized by the equalizing unit.

4. The memory device according to claim 3, wherein the discharging circuit separately discharges the respective voltages of the word lines.

5. The memory device according to claim 3, wherein the discharging circuit discharges the voltage of the word lines at a slow discharging speed that is smaller than a discharging speed of a natural discharging.

6. The memory device according to claim 1, further comprising:
a source side discharging circuit that discharges a voltage of a source side word line that is connected to a memory cell adjacent to the source side selecting gate,
wherein the discharging circuit discharges a voltage of the source side word line at a first discharging speed that is smaller than a discharging speed at the word lines except the source side word line.

7. The memory device according to claim 6, further comprising:

a drain side discharging circuit that discharges a voltage of a drain side word line that is connected to a memory cell adjacent to the drain side selecting gate,
wherein the discharging circuit discharges a voltage of the drain side word line at a second discharging speed that is smaller than the discharging speed at the word lines except the source side word line and the drain side word line.

8. The memory device according to claim 3, wherein the discharging circuit includes a discharge current controller that controls discharge currents of the word lines when the discharging circuit discharges voltages of the word lines.

9. The memory device according to claim 1, wherein the plurality of memory cells include a floating gate type memory cell.

10. The memory device according to claim 1, wherein the plurality of memory cells include a MONOS type memory cell.

11. The memory device according to claim 2, wherein the shorting controller includes a level shifter circuit.

12. The memory device according to claim 2, wherein the shorting controller includes a local pump circuit.

13. A control method for a nonvolatile semiconductor memory device having:
a memory cell array having:
a cell string including a plurality of memory cells connected in series;
a plurality of word lines respectively connected to the plurality of memory cells;
a source side selecting gate connected to one end of the cell string; and
a drain side selecting gate connected to the other end of the cell string,
the method comprising:
selecting one of the word lines that is connected to a target memory cell to be written;
writing a data to the target memory cell; and
equalizing the word lines after finishing the writing step.

14. The control method according to claim 13, wherein the equalizing step includes shorting the word lines.

15. The control method according to claim 13, further comprising:
discharging voltages of the word lines equalized by the equalizing step,
wherein the discharging step includes controlling the discharging speed of the word lines.

* * * * *